(12) United States Patent
Ahn et al.

(10) Patent No.: US 11,114,461 B2
(45) Date of Patent: Sep. 7, 2021

(54) THREE-DIMENSIONAL SEMICONDUCTOR MEMORY DEVICES HAVING SOURCE STRUCTURE OVERLAPS BURIED INSULATING LAYER

(71) Applicant: SAMSUNG ELECTRONICS CO., LTD., Suwon-si (KR)

(72) Inventors: Jongseon Ahn, Suwon-si (KR); Jaeryong Sim, Suwon-si (KR); Giyong Chung, Suwon-si (KR); Jeehoon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 3 days.

(21) Appl. No.: 16/700,059

(22) Filed: Dec. 2, 2019

(65) Prior Publication Data
US 2020/0350330 A1 Nov. 5, 2020

(30) Foreign Application Priority Data
Apr. 30, 2019 (KR) .................. 10-2019-0050750

(51) Int. Cl.
*H01L 27/11524* (2017.01)
*H01L 27/11582* (2017.01)
(Continued)

(52) U.S. Cl.
CPC .. *H01L 27/11582* (2013.01); *H01L 21/31116* (2013.01); *H01L 23/60* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 29/0653* (2013.01)

(58) Field of Classification Search
CPC ......... H01L 27/11524; H01L 27/11529; H01L 27/11553; H01L 27/11556; H01L 27/1157; H01L 27/11582
See application file for complete search history.

(56) References Cited

U.S. PATENT DOCUMENTS

| 8,829,646 B2 | 9/2014 | Lung et al. |
| 9,412,749 B1 | 8/2016 | Shimabukuro et al. |
(Continued)

*Primary Examiner* — Hoai V Pham
(74) *Attorney, Agent, or Firm* — F. Chau & Associates, LLC

(57) ABSTRACT

A three-dimensional (3D) semiconductor memory device including: first and second semiconductor layers horizontally spaced apart from each other; a buried insulating layer between the first and second semiconductor layers; a first cell array structure disposed on the first semiconductor layer, and a second cell array structure disposed on the second semiconductor layer; and an isolation structure disposed on the buried insulating layer between the first and second cell array structures, wherein the first cell array structure includes: an electrode structure including electrodes, which are stacked in a direction perpendicular to a top surface of the first semiconductor layer; and a first source structure disposed between the first semiconductor layer and the electrode structure, the first source structure is extended onto the buried insulating layer, and the isolation structure is between the first source structure of the first cell array structure and a second source structure of the second cell array structure.

20 Claims, 23 Drawing Sheets

(51) Int. Cl.
  *H01L 27/11556* (2017.01)
  *H01L 27/11529* (2017.01)
  *H01L 23/60* (2006.01)
  *H01L 27/11573* (2017.01)
  *H01L 29/06* (2006.01)
  *H01L 21/311* (2006.01)
  *H01L 27/1157* (2017.01)

(56) References Cited

U.S. PATENT DOCUMENTS

| | | |
|---|---|---|
| 9,768,186 B2 | 9/2017 | Shimabukuro et al. |
| 9,837,429 B2 | 12/2017 | Son et al. |
| 9,853,043 B2 | 12/2017 | Lu et al. |
| 9,905,570 B2 | 2/2018 | Shin et al. |
| 10,026,750 B1 | 7/2018 | Lai et al. |
| 2009/0324786 A1 | 12/2009 | Mcnaughton |
| 2020/0098782 A1* | 3/2020 | Nojima ............. H01L 27/11575 |

* cited by examiner

THREE-DIMENSIONAL SEMICONDUCTOR MEMORY DEVICES HAVING SOURCE STRUCTURE OVERLAPS BURIED INSULATING LAYER

CROSS-REFERENCE TO RELATED APPLICATION

This U.S. non-provisional patent application claims priority under 35 U.S.C. § 119 to Korean Patent Application No. 10-2019-0050750, filed on Apr. 30, 2019, in the Korean Intellectual Property Office, the disclosure of which is incorporated by reference herein in its entirety.

TECHNICAL FIELD

The present inventive concept relates to a semiconductor memory device, and in particular, to a three-dimensional semiconductor memory device, in which memory cells are three-dimensionally arranged.

DISCUSSION OF RELATED ART

Highly integrated semiconductor devices with superior performance and inexpensive prices are in constant demand in the consumer electronics market. In terms of integration, semiconductor devices may be two-dimensional or three-dimensional. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness makes it impractical to pursue increased integration for two-dimensional or planar semiconductor devices. Accordingly, three-dimensional semiconductor memory devices including three-dimensionally arranged memory cells are being employed to increase integration.

SUMMARY

According to an exemplary embodiment of the inventive concept, there is provided a three-dimensional (3D) semiconductor memory device including: first and second semiconductor layers horizontally spaced apart from each other; a buried insulating layer between the first and second semiconductor layers; a first cell array structure disposed on the first semiconductor layer, and a second cell array structure disposed on the second semiconductor layer; and an isolation structure disposed on the buried insulating layer between the first and second cell array structures, wherein the first cell array structure includes: an electrode structure including electrodes, which are stacked in a direction perpendicular to a top surface of the first semiconductor layer; and a first source structure disposed between the first semiconductor layer and the electrode structure, the first source structure is extended onto the buried insulating layer, and the isolation structure is between the first source structure of the first cell array structure and a second source structure of the second cell array structure.

According to an exemplary embodiment of the inventive concept, there is provided a 3D semiconductor memory device including: first and second semiconductor layers horizontally spaced apart from each other, on a substrate; first and second cell array structures disposed on the first and second semiconductor layers, respectively; and an isolation structure disposed on the substrate between the first and second cell array structures, wherein the first cell array structure includes: an electrode structure including electrodes, which are stacked in a direction perpendicular to a top surface of the first semiconductor layer; and a first source structure disposed between the first semiconductor layer and the electrode structure, and the first source structure of the first cell array structure is horizontally extended onto an area of the substrate between the first and second semiconductor layers and the first source structure of the first cell array structure and a second source structure of the second cell array structure are electrically separated from each other by the isolation structure.

According to an exemplary embodiment of the inventive concept, there is provided a 3D semiconductor memory device including: peripheral circuits on a substrate; a lower insulating layer disposed on the substrate to cover the peripheral circuits; a semiconductor layer on the lower insulating layer; a cell array structure on the semiconductor layer; and an isolation structure disposed on the lower insulating layer and at a side of the cell array structure, wherein the cell array structure includes: an electrode structure including electrodes, which are stacked in a direction perpendicular to a top surface of the semiconductor layer; and a source structure disposed between the semiconductor layer and the electrode structure, and the source structure is extended from the semiconductor layer onto the lower insulating layer and is in contact with a side surface of the isolation structure.

According to an exemplary embodiment of the inventive concept, there is provided a 3D semiconductor memory device including: first and second semiconductor layers separated from each other by a buried insulating layer; a first cell array disposed on the first semiconductor layer, and a second cell array disposed on the second semiconductor layer; and an isolation structure disposed on the buried insulating layer and separating the first and second cell arrays from each other, wherein the first cell array includes: a plurality electrodes stacked in a direction perpendicular to a top surface of the first semiconductor layer; and a source structure disposed between the first semiconductor layer and a lowermost one of the electrodes, wherein the source structure overlaps the buried insulating layer.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
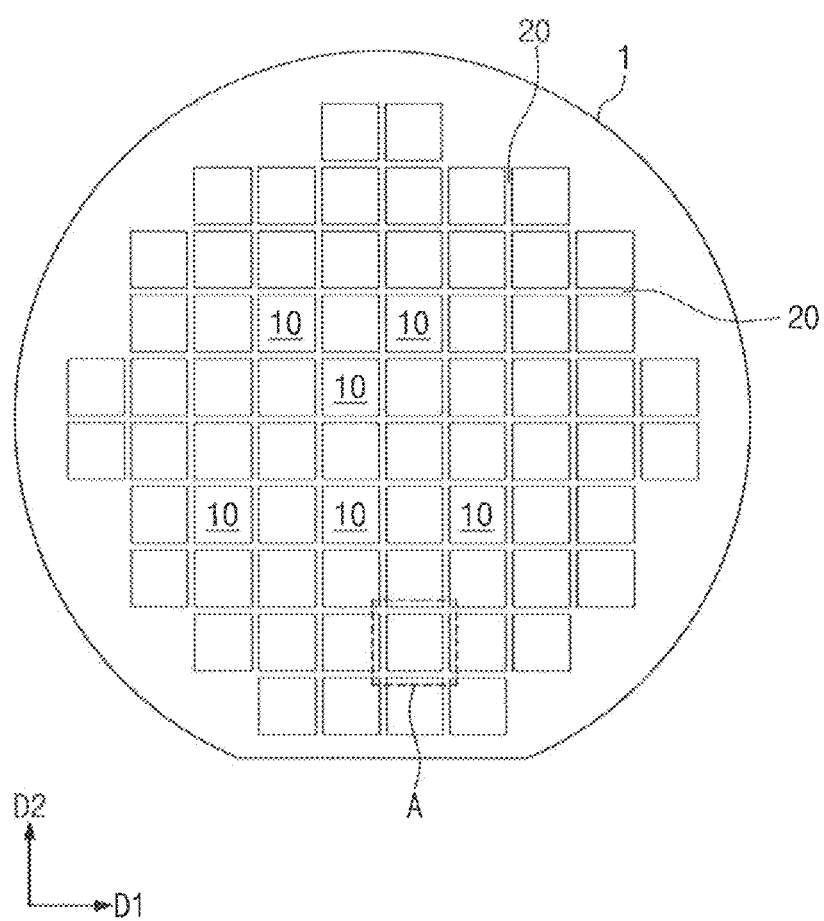
FIG. 1 is a diagram illustrating a semiconductor substrate, on which three-dimensional semiconductor memory devices according to exemplary embodiments of the inventive concept are integrated.

Exemplary embodiments of the inventive concept will now be described more fully with reference to the accompanying drawings.

It should be noted that the drawings are not necessarily to scale, and thus, should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the drawings may indicate the presence of a similar or identical element or feature.

FIG. 1 is a diagram illustrating a semiconductor substrate, on which three-dimensional semiconductor memory devices according to exemplary embodiments of the inventive concept are integrated.

Referring to FIG. 1, a semiconductor substrate 1 (e.g., a wafer) may include chip regions 10, on which semiconductor chips are respectively formed, and a scribe line region 20, which is located between the chip regions 10. The chip regions 10 may be two-dimensionally arranged in two different directions (e.g., a first direction D1 and a second direction D2). Each of the chip regions 10 may be enclosed by the scribe line region 20, when viewed in a plan view. In other words, the scribe line region 20 may be interposed between the chip regions 10 adjacent to each other in the first direction D1 and between the chip regions 10 adjacent to each other in the second direction D2. The semiconductor substrate 1 may be a bulk silicon wafer, a silicon-on-insulator (SOI) wafer, a germanium wafer, a germanium-on-insulator (GOI) wafer, a silicon-germanium wafer, or a wafer including an epitaxial layer formed by a selective epitaxial growth (SEG) process. The semiconductor substrate 1 may be formed of or include silicon (Si), germanium (Ge), silicon germanium (SiGe), gallium arsenic (GaAs), indium gallium arsenic (InGaAs), or aluminum gallium arsenic (AlGaAs). A three-dimensional semiconductor memory device, in which memory cells are three-dimensionally arranged, may be provided on each of the chip regions 10 of the semiconductor substrate 1.

Figure 2:
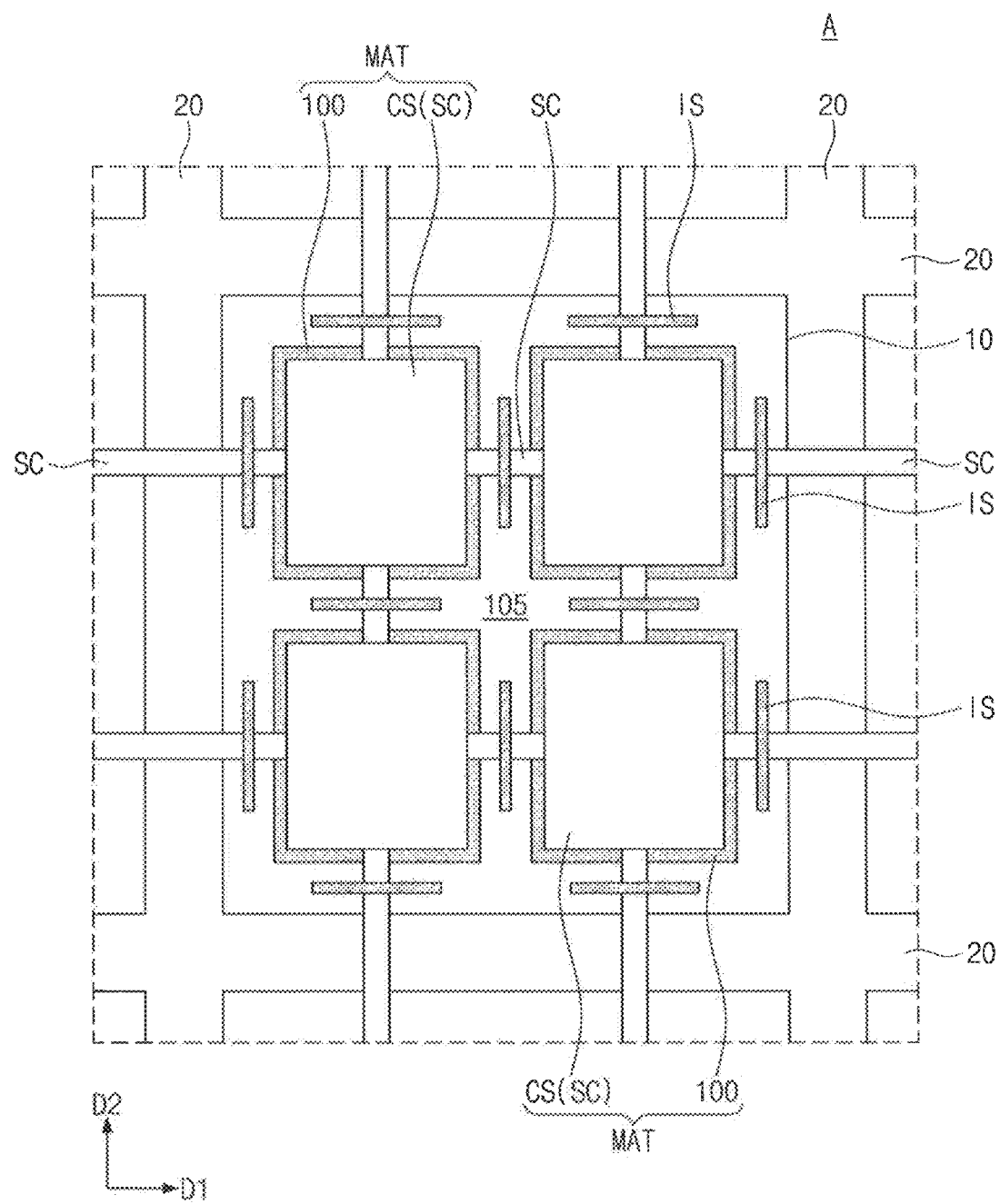
FIG. 2 is an enlarged plan view schematically illustrating a portion (e.g., portion 'A' of FIG. 1) of a three-dimensional semiconductor memory device according to an exemplary embodiment of the inventive concept.

FIG. 2 is an enlarged plan view schematically illustrating a portion (e.g., portion 'A' of FIG. 1) of a three-dimensional semiconductor memory device according to an exemplary embodiment of the inventive concept.

Referring to FIGS. 1 and 2, a plurality of cell array structures CS may be disposed on each of the chip regions 10 of the semiconductor substrate 1. On each of the chip regions 10, the cell array structures CS may be arranged in the first and second directions D1 and D2 and may be spaced apart from each other. Each of the cell array structures CS may include a cell array, in which a plurality of memory cells are three-dimensionally arranged. The cell array structures CS may be disposed on a plurality of semiconductor layers 100, respectively. On each of the chip regions 10, the semiconductor layers 100 may be arranged in the first and second directions D1 and D2 and may be spaced apart from each other. Each of the cell array structures CS and a corresponding one of the semiconductor layers 100 may constitute a single mat MAT. In this case, the mat MAT may be a unit region of the three-dimensional semiconductor memory device, on which an erase operation can be independently performed. For example, an erase operation may not be performed on a first MAT, while an erase operation is performed on a second MAT.

A buried insulating layer 105 may be disposed on each of the chip regions 10 and may be interposed between the semiconductor layers 100. Each of the semiconductor layers 100 may be enclosed by the buried insulating layer 105, when viewed in a plan view. For example, the semiconductor layers 100 may be surrounded by the buried insulating layer 105. The buried insulating layer 105 may be interposed between the semiconductor layers 100 adjacent to each other in the first direction D1 and between the semiconductor layers 100 adjacent to each other in the second direction D2. The cell array structures CS may include source structures SC, respectively. The source structures SC may be extended in a horizontal direction (e.g., in the first and second directions D1 and D2), on the semiconductor layers 100, and cross the scribe line regions 20. In addition, the source structures SC may be extended from regions on the semiconductor layers 100 to a region on the buried insulating layer 105 between the semiconductor layers 100.

A plurality of isolation structures IS may be disposed on each of the chip regions 10 of the semiconductor substrate 1. The isolation structures IS may be disposed on the buried insulating layer 105 between the semiconductor layers 100 and may be disposed at locations around each of the cell array structures CS, when viewed in a plan view. In exemplary embodiments of the inventive concept, the isolation structures IS disposed around each of the cell array structures CS may be spaced apart from each other. A first one of the isolation structures IS may be disposed between a first pair of the cell array structures CS adjacent to each other in the first direction D1, and in this case, the first one of the isolation structures IS may have a line shape extending in the second direction D2. A second one of the isolation structures IS may be disposed between a second pair of the cell array structures CS adjacent to each other in the second direction D2, and in this case, the second one of the isolation structures IS may have a line shape extending in the first direction D1.

The source structures SC of the cell array structures CS may be electrically disconnected from each other by the isolation structures IS. The source structure SC of each of the cell array structures CS may be horizontally extended onto the buried insulating layer 105 and may be in contact with corresponding ones of the isolation structures IS. Each of the isolation structures IS may be interposed between adjacent ones of the source structures SC of the cell array structures CS and may electrically separate the adjacent ones of the source structures SC from each other. The first one of the isolation structures IS may be interposed between the source structures SC of the first pair of the cell array structures CS, which are adjacent to each other in the first direction D1, and may electrically separate the source structures SC of the first pair of the cell array structures CS from each other. The source structures SC of the first pair of the cell array structures CS may he horizontally extended onto the buried insulating layer 105 and may he in contact with the first one of the isolation structures IS. The second one of the isolation structures IS may be interposed between the source structures SC of the second pair of the cell array structures CS, which are adjacent to each other in the second direction D2, to electrically separate the source structures SC of the second pair of the cell array structures CS from each other. The source structures SC of the second pair of the cell array structures CS may be horizontally extended onto the buried insulating layer 105 and may he in contact with the second one of the isolation structures IS.

Figure 3:
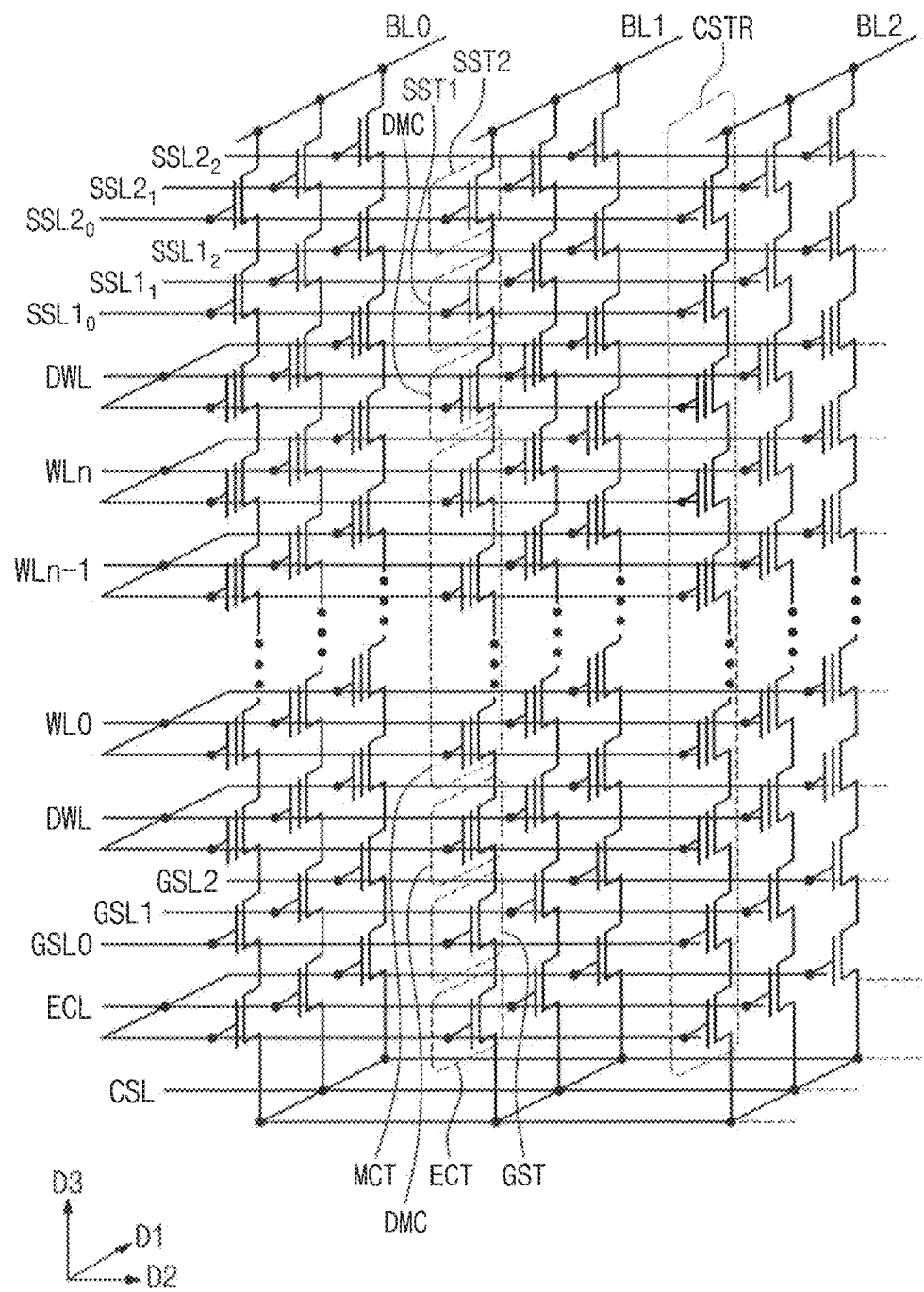
FIG. 3 is a circuit diagram schematically illustrating a cell array of a three-dimensional semiconductor memory device according to an exemplary embodiment of the inventive concept.

FIG. 3 is a circuit diagram schematically illustrating a cell array of a three-dimensional semiconductor memory device according to an exemplary embodiment of the inventive concept.

Referring to FIG. 3, each of the cell array structures CS of FIG, 2 may include a common source line CSL, a plurality of hit lines BL0, BL1 and BL2, and a plurality of cell strings CSTR, which are disposed between the common source line CSL and the hit lines BL0-BL2. A plurality of cell strings CSTR may he connected in parallel to each of the hit lines BL0-BL2. The cell strings CSTR may be connected in common to the common source line CSL. Each of the cell strings CSTR may include string selection transistors SST1 and SST2, memory cell transistors MCT, a ground selection transistor GST, and an erase control transistor ECT, which are connected in series. Each of the memory cell transistors MCT may include a data storage element. As an example, each of the cell strings CSTR may include first and second string selection transistors SST1 and SST2, which are connected in series, and the second string selection transistor SST2 may be coupled to a corresponding one of the bit lines BL0, BL1, and BL2. in exemplary embodiments of the inventive concept, each of the cell strings CSTR may have a single string selection transistor.

The memory cell transistors MCT may be connected in series to each other, between the first string selection transistor SST1 and the ground selection transistor GST. The erase control transistor ECT of each of the cell strings CSTR may be disposed between and connected to the ground selection transistor GST and the common source line CSL. In exemplary embodiments of the inventive concept, each of the cell strings CSTR may further include dummy cells DMC, which are connected between the first string selection transistor SST1 and the memory cell transistor MCT and/or between the ground selection transistor GST and the memory cell transistor MCT. The first string selection transistor SST1 may be controlled by a first string selection line SSL1 (e.g. $SSL1_0$, $SSL1_1$, or $SSL1_2$), and the second string selection transistor SST2 may be controlled by a second string selection line SSL2 (e.g. $SSL2_0$, $SSL2_1$, or $SSL2_2$). The memory cell transistors MCT may be controlled by signals transited through a plurality of word lines WL0-WLn, and the dummy cells DMC may be controlled by signals transited through a dummy word line DWL. In addition, the ground selection transistor GST may be controlled by signals transited through a ground selection line GSL (e.g., GSL0, GSL1, or GSL2), and the erase control transistor ECT may be controlled by signals transited through an erase control line ECL. The common source line CSL may he connected in common to sources of the erase control transistors ECT. The erase control transistors ECT of different ones of the cell strings CSTR may be controlled in common by signals transited through the erase control line EU. The erase control transistors ECT may produce a gate-induced-drain-leakage (GIDL), during an erase operation on the memory cell array.

Figure 4:
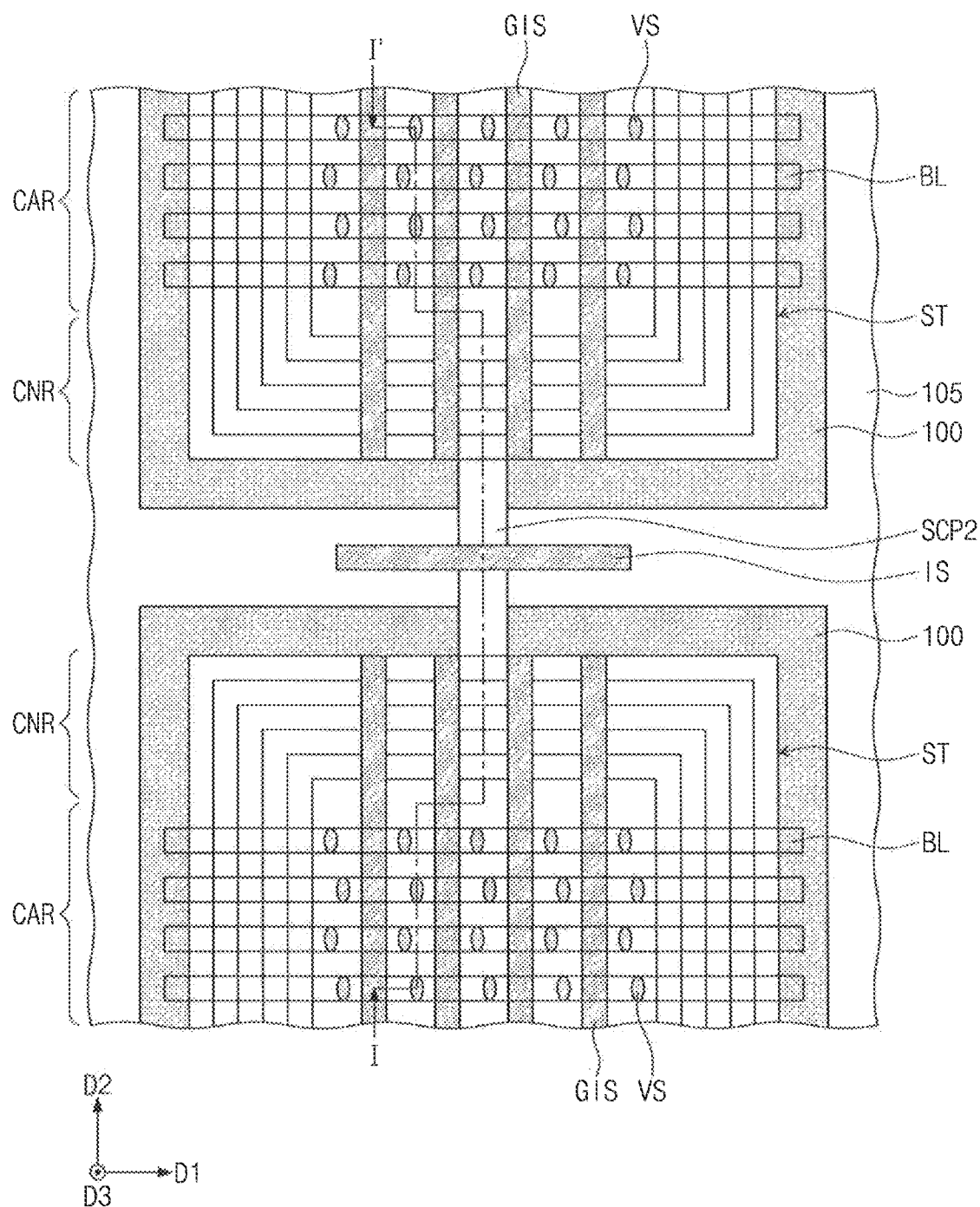
FIG. 4 is a plan view illustrating a three-dimensional semiconductor memory device according to an exemplary embodiment of the inventive concept.
Figure 5:
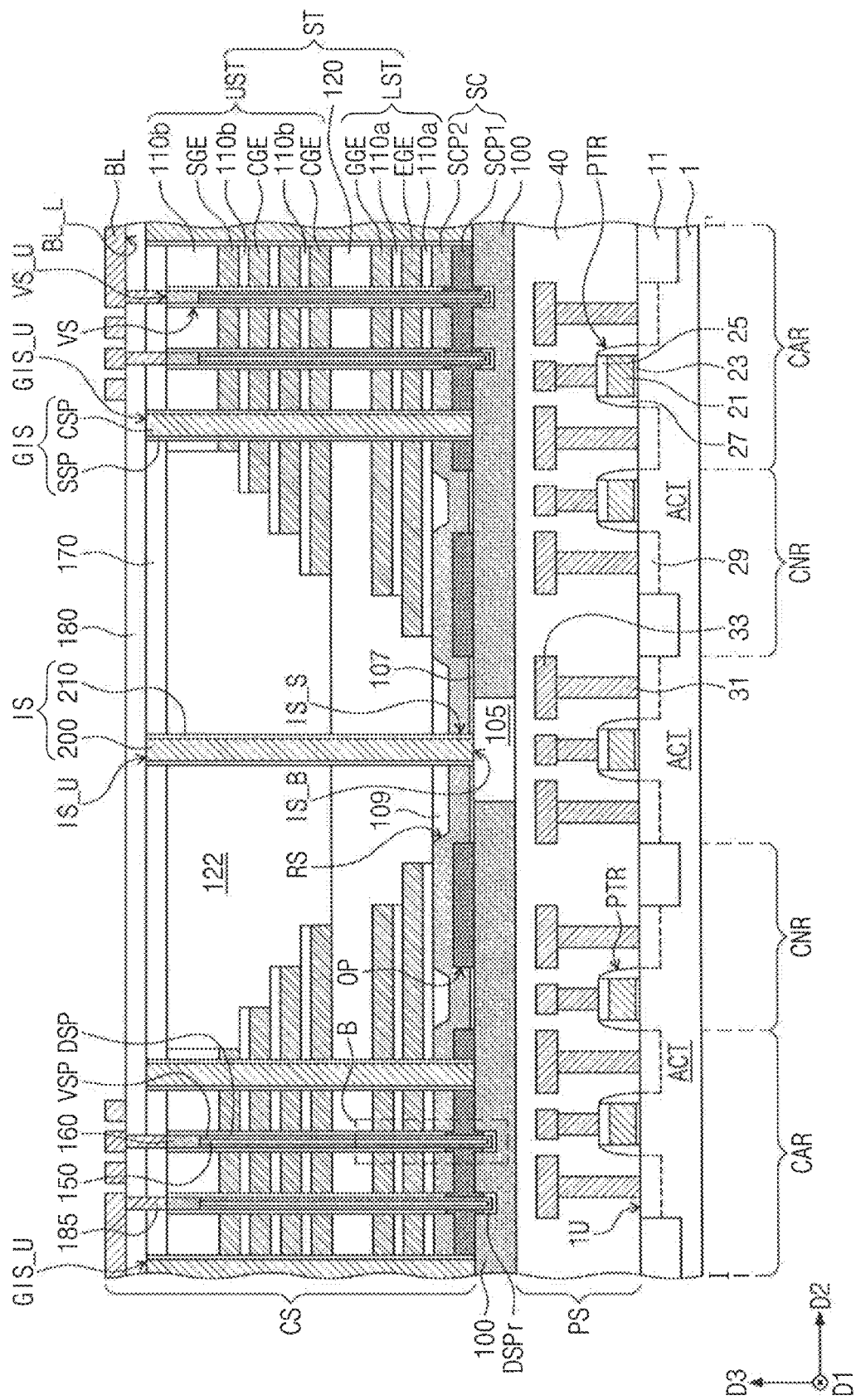
FIG. 5 is a sectional view taken along a line I-I' of FIG. 4.
Figure 6:
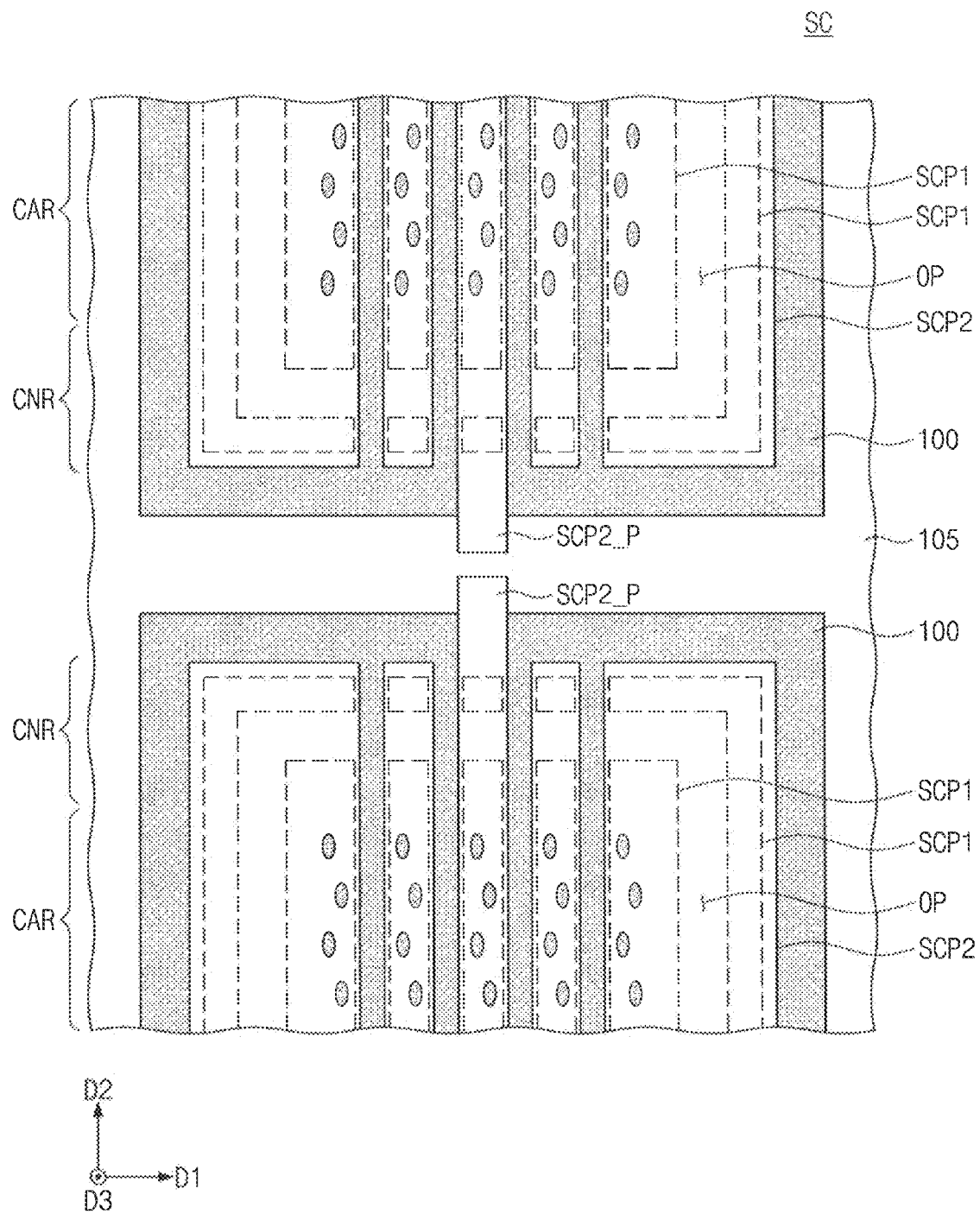
FIG. 6 is a plan view illustrating a source structure SC of FIG. 5.
Figure 7:
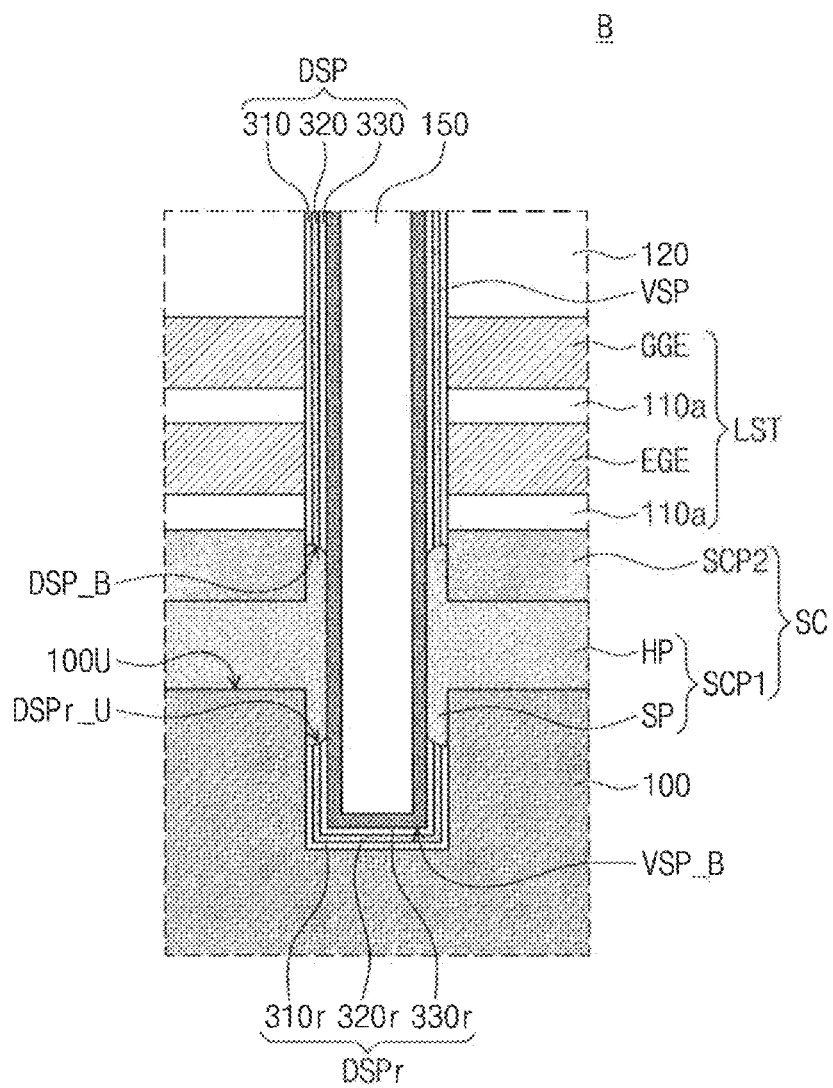
FIG. 7 is an enlarged view of a portion 'B' of FIG. 5.

FIG. 4 is a plan view illustrating a three-dimensional semiconductor memory device according to an exemplary embodiment of the inventive concept. FIG. 5 is a sectional view taken along a line I-I' of FIG. 4. FIG. 6 is a plan view illustrating a source structure SC of FIG. 5, and FIG. 7 is an enlarged view of a portion 'B' of FIG. 5.

Referring to FIGS. 4 and 5, a peripheral circuit structure PS may be disposed on the semiconductor substrate 1. The semiconductor substrate 1 may be a silicon wafer, a silicon-germanium wafer, a germanium wafer, or a single-crystalline epitaxial layer grown on a single-crystalline silicon wafer. The peripheral circuit structure PS may include peripheral circuits, which are integrated on the semiconductor substrate 1, and a lower insulating layer 40, which covers the peripheral circuits. The peripheral circuits may be row and column decoders for controlling the cell array, a page buffer, and a control circuit, and may include n-type metal-oxide-semiconductor (NMOS) and p-type metal-oxide-semiconductor (PMOS) transistors, low and high voltage transistors, and resistors, which are integrated on the semiconductor substrate 1.

As an example, a device isolation layer 11 may be disposed in the semiconductor substrate 1 to define an active region ACT. A plurality of peripheral transistors PTR may be disposed on the active region ACT of the semiconductor substrate 1. Each of the peripheral transistors PTR may include a peripheral gate electrode 21 on the semiconductor substrate 1, a peripheral gate insulating layer 23 between the semiconductor substrate 1 and the peripheral gate electrode 21, a peripheral gate capping pattern 25 on the peripheral gate electrode 21, and peripheral gate spacers 27 on side surfaces of the peripheral gate electrode 21. Each of the peripheral transistors PTR may further include peripheral source/drain regions 29, which are disposed in portions of the semiconductor substrate 1 at both sides of the peripheral gate electrode 21. Peripheral circuit interconnection lines 33 may be electrically connected to the peripheral source/drain regions 29 of the peripheral transistors PTR through peripheral contact plugs 31. The peripheral transistors PTR, the peripheral circuit interconnection lines 33, and the peripheral contact plugs 31 may constitute the peripheral circuits (e.g., row and column decoders, a page buffer, a control circuit, and so forth).

The lower insulating layer 40 may cover the peripheral transistors PTR, the peripheral circuit interconnection lines 33, and the peripheral contact plugs 31. The lower insulating layer 40 may include a silicon oxide layer, a silicon nitride layer, a silicon oxynitride layer, and/or low-k dielectric layers.

Semiconductor layers 100 may be disposed on the lower insulating layer 40 to be horizontally spaced apart from each other. The semiconductor layers 100 may be spaced apart from each other in a direction (e.g., the second direction D2), which is parallel to a top surface 1U of the semiconductor substrate 1, and bottom surfaces of the semiconductor layers 100 may be in contact with the lower insulating layer 40. The semiconductor layers 100 may be formed of a semiconductor material and may include, for example, silicon (Si), germanium (Ge), silicon germanium (SiGe), gallium arsenic (GaAs), indium gallium arsenic (InGaAs), or aluminum gallium arsenic (AlGaAs). The semiconductor layers 100 may include a doped semiconductor material of a first conductivity type and/or an undoped or intrinsic semiconductor material and may have single crystalline, amorphous, or polycrystalline structures.

A buried insulating layer 105 may be disposed between the semiconductor layers 100 and on the lower insulating layer 40. The semiconductor layers 100 may be separated from each other by the buried insulating layer 105, and a bottom surface of the buried insulating layer 105 may be in contact with the lower insulating layer 40. The buried insulating layer 105 may include, for example, a silicon oxide layer, a silicon nitride layer, a silicon oxynitride layer, and/or dielectric layers.

Cell array structures CS may be disposed on the semiconductor layers 100, respectively. Each of the cell array structures CS may include a source structure SC and an electrode structure ST, which are sequentially stacked on each of the semiconductor layers 100. The source structure SC may be interposed between each of the semiconductor layers 100 and the electrode structure ST. The source structure SC and the electrode structure ST may be sequentially stacked in a third direction D3, which is perpendicular to the top surface 1U of the semiconductor substrate 1.

Each of the semiconductor layers 100 may include a cell array region CAR and a connection region CNR. The electrode structure ST may be disposed on the cell array region CAR of each of the semiconductor layers 100 and may be extended from the cell array region CAR onto the connection region CNR in a direction (e.g., the second direction D2), which is parallel to the top surface 1U of the semiconductor substrate 1. The source structure SC may be disposed below the electrode structure ST and may be extended from the cell array region CAR onto the connection region CNR in a direction (e.g., the second direction D2), which is parallel to the top surface 1U of the semiconductor substrate 1. The source structure SC may be further extended onto the buried insulating layer 105 between the semiconductor layers 100.

The source structure SC may include a first source conductive pattern SCP1 and a second source conductive pattern SCP2, which are sequentially stacked on each of the semiconductor layers 100. The first source conductive pattern SCP1 may be in direct contact with each of the semiconductor layers 100. In exemplary embodiments of the inventive concept, an insulating layer may be provided between the first source conductive pattern SCP1 and each of the semiconductor layers 100. The first and second source conductive patterns SCP1 and SCP2 may include a doped semiconductor material of a second conductivity type. An impurity concentration of the first source conductive pattern SCP1 may be higher than that of the second source conductive pattern SCP2. In exemplary embodiments of the inventive concept, the second source conductive pattern SCP2 may include a metallic material.

Referring to FIGS. 5 and 6, the first source conductive pattern SCP1 may he locally provided on each of the semiconductor layers 100 and may have an opening OP, which is formed to expose a portion of the semiconductor layer 100. A first portion of the first source conductive pattern SCP1 may be disposed on the cell array region CAR of each of the semiconductor layers 100, and a second portion of the first source conductive pattern SCP1 may be disposed on the connection region CNR of each of the semiconductor layers 100. The opening OP may be provided on the connection region CNR of each of the semiconductor layers 100 and between the first and second portions of the first source conductive pattern SCP1.

The second source conductive pattern SCP2 may cover a top surface of the first source conductive pattern SCP1 and may fill the opening OP in the first source conductive pattern SCP1. For example, a portion of the second source conductive pattern SCP2 may cover an inner surface of the opening OP in the first source conductive pattern SCP1 and may be in contact with a first insulating layer 107 on each of the semiconductor layers 100. In exemplary embodiments of the inventive concept, the first insulating layer 107 may be omitted, and in this case, the portion of the second source conductive pattern SCP2 may be in direct contact with each of the semiconductor layers 100. The second source conductive pattern SCP2 may be extended onto the buried insulating layer 105 between the semiconductor layers 100 in a direction (e.g., the second direction D2), which is parallel to the top surface 1U of the semiconductor substrate 1. In exemplary embodiments of the inventive concept, the second source conductive pattern SCP2 may include at least one protruding portion SCP2_P, which is extended from each of the semiconductor layers 100 onto the buried insulating layer 105. The first insulating layer 107 may be disposed on the buried insulating layer 105 and may be interposed between the second source conductive pattern SCP2 and the buried insulating layer 105. The second source conductive pattern SCP2 may have recessed top surfaces RS, and a second insulating layer 109 may be disposed on the recessed top surfaces RS of the second source conductive pattern SCP2. The first insulating layer 107 and the second insulating layer 109 may include, for example, a silicon oxide layer.

Referring back to FIGS. 4 and 5, the electrode structure ST may include a lower electrode structure LST, an upper electrode structure UST, and an insulating planarization layer 120, which is provided between the lower and upper electrode structures LST and UST. The lower electrode structure LST may include lower gate electrodes EGE and GGE and lower insulating layers 110a, which are alternately stacked on the source structure SC and in the third direction D3. The upper electrode structure UST may include upper gate electrodes CGE and SGE and upper insulating layers 110b, which are alternately stacked on the insulating planarization layer 120 and in the third direction D3. The insulating planarization layer 120 may be interposed between the topmost gate electrode GGE of the lower gate electrodes EGE and GGE and the lowermost gate electrode CGE of the upper gate electrodes CGE and SGE. Each of the lower insulating layers 110a, the upper insulating layers 110b, and the insulating planarization layer 120 may have a thickness in the third direction D3. The insulating planarization layer 120 may be thicker than the lower and upper insulating layers 110a and 110b. The topmost insulating layer 110b of the lower and upper insulating layers 110a and 110b may be thicker than the rest of the lower and upper insulating layers 110a and 110b. The lower gate electrodes EGE and GGE and the upper gate electrodes CGE and SGE may include doped semiconductor materials (e.g., doped silicon and so forth), metallic materials (e.g., tungsten, copper, aluminum, and so forth), conductive metal nitrides (e.g., titanium nitride, tantalum nitride, and so forth), and/or transition metals (e.g., titanium, tantalum, and so forth). The lower insulating layers 110a, the upper insulating layers 110b, and the insulating planarization layer 120 may include a silicon oxide layer and/or low-k dielectric layers.

The lower gate electrodes EGE and GGE may include an erase control gate electrode EGE and a ground selection gate electrode GGE on the erase control gate electrode EGE. The erase control gate electrode EGE may be disposed adjacent to the source structure SC. The lowermost one of the lower insulating layers 110a may be interposed between the erase control gate electrode EGE and the source structure SC. The erase control gate electrode EGE may be a gate electrode of an erase control transistor ECT, which is used to control an erase operation on the memory cell array of FIG. 3. The ground selection gate electrode GGE may be a gate electrode of the ground selection transistor GST of FIG. 3. The upper gate electrodes CGE and SGE may include cell gate electrodes CGE and a string selection gate electrode SGE. The cell gate electrodes CGE may be provided between the ground selection gate electrode GGE and the string selection gate electrode SGE and may be positioned at different heights from the top surface 1U of the semiconductor substrate 1. The cell gate electrodes CGE may be gate electrodes of the memory cell transistors MCT of FIG. 3. The string selection gate electrode SGE may be a gate electrode of the string selection transistor SST2 of FIG. 3. In exemplary embodiments of the inventive concept, an additional string selection gate electrode SGE may be provided between the topmost one of the cell gate electrodes CGE and the string selection gate electrode SGE. In this case, the additional string selection gate electrode SGE may be a gate electrode of the string selection transistor SST1 of FIG. 3. Lengths of the gate electrodes EGE, GGE, CGE, and SGE of the electrode structure ST (e.g., measured in the second direction D2) may decrease with increasing distance from each of the semiconductor layers 100. The gate electrodes EGE, GGE, CGE, and SGE of the electrode structure ST may include electrode pads, which are disposed to form a stepwise structure on the connection region CNR.

The insulating planarization layer 120 may cover the lower electrode structure LST and may be extended onto the buried insulating layer 105, in a direction (e.g., the second direction D2), which is parallel to the top surface 1U of the semiconductor substrate 1. A first capping insulating layer 122 may be disposed on the connection region CNR of each of the semiconductor layers 100 to cover the electrode pads, which are disposed to form the stepwise structure. The first capping insulating layer 122 may be extended onto the buried insulating layer 105, in a direction (e.g., the second direction D2) which is parallel to the top surface 1U of the semiconductor substrate 1, and may cover the insulating planarization layer 120. The first capping insulating layer 122 may include an insulating material (e.g., silicon oxide).

Each of the cell array structures CS may include a plurality of vertical structures VS, which are provided to penetrate the source structure SC and the electrode structure ST. The vertical structures VS may be disposed on the cell array region CAR of each of the semiconductor layers 100. Each of the vertical structures VS may be extended in the third direction D3 to penetrate the electrode structure ST and the source structure SC. In an exemplary embodiment of the inventive concept, the vertical structures VS may be arranged to form a zigzag shape in the second direction D2, when viewed in a plan view.

Referring to FIGS. 5 and 7, each of the vertical structures VS may include a vertical semiconductor pattern VSP. The vertical semiconductor pattern VSP may be extended in the third direction D3 to penetrate the electrode structure ST and the source structure SC. The vertical semiconductor pattern VSP may he extended into each of the semiconductor layers 100. The vertical semiconductor pattern VSP may have a bottom surface VSP_B, which is positioned in each of the semiconductor layers 100. The vertical semiconductor pattern VSP may be shaped like a bottom-closed pipe. The vertical semiconductor pattern VSP may include a semiconductor material, such as silicon (Si), germanium (Ge), or compounds thereof. In an exemplary embodiment of the inventive concept, the vertical semiconductor pattern VSP may be formed of or include a doped semiconductor material or an undoped or intrinsic semiconductor material. The vertical semiconductor pattern VSP may be used as a channel of each of the erase control transistor ECT, the string and ground selection transistors SST1, SST2, and GST, and the memory cell transistors MCT, described with reference to FIG. 3.

A lower side surface of the vertical semiconductor pattern VSP may be in contact with the first source conductive pattern SCP1. The first source conductive pattern SCP1 may include a horizontal portion HP, which is disposed below the second source conductive pattern SCP2 and is extended substantially parallel to the top surface 1U of the semiconductor substrate 1, and a vertical portion SP, which vertically protrudes from the horizontal portion HP. The vertical portion SP of the first source conductive pattern SCP1 may be in contact with a portion of a side surface of the vertical semiconductor pattern VSP and may enclose the portion of the side surface of the vertical semiconductor pattern VSP. The horizontal portion HP of the first source conductive pattern SCP1 may he interposed between a top surface 100U of each of the semiconductor layers 100 and the second source conductive pattern SCP2. The horizontal portion HP of the first source conductive pattern SCP1 may be in contact with the top surface 100U of each of the semiconductor layers 100. The vertical portion SP of the first source conductive pattern SCP1 may be extended into regions between the side surface of the vertical semiconductor pattern VSP and each of the semiconductor layers 100 and between the side surface of the vertical semiconductor pattern VSP and the second source conductive pattern SCP2. In other words, a first part of the vertical portion SP of the first source conductive pattern SCP1 may be disposed between a side of the vertical semiconductor pattern VSP and a side of the semiconductor layer 100, and a second part of the vertical portion SP of the first source conductive pattern SCP1 may be disposed between the side of the vertical semiconductor pattern VSP and a side of the second source conductive pattern SCP2.

Each of the vertical structures VS may include a data storage pattern DSP, which is interposed between the vertical semiconductor pattern VSP and the electrode structure ST. The data storage pattern DSP may be extended in the third direction D3 and may enclose the side surface of the vertical semiconductor pattern VSP. The data storage pattern DSP may have a pipe shape whose top and bottom are opened. A bottom surface DSP_B of the data storage pattern DSP may be in contact with the first source conductive pattern SCP1. The data storage pattern DSP may include a data storing layer of a NAND FLASH memory device. For example, the data storage pattern DSP may include a charge storing layer 320 between the vertical semiconductor pattern VSP and the electrode structure ST, a blocking insulating layer 310 between the electrode structure ST and the charge storing layer 320, and a tunnel insulating layer 330 between the vertical semiconductor pattern VSP and the charge storing layer 320. The charge storing layer 320 may include a silicon nitride layer, a silicon oxynitride layer, a silicon-rich nitride layer, a nanocrystalline silicon layer, or a laminated trap layer. The blocking insulating layer 310 may include a material, whose band gap is larger than that of the charge storing layer 320. The blocking insulating layer 310 may include high-k dielectric materials, such as aluminum oxide and hafnium oxide. The tunnel insulating layer 330 may include a material, whose band gap is larger than that of the charge storing layer 320. The tunnel insulating layer 330 may include, for example, a silicon oxide layer.

Each of the vertical structures VS may include a remaining data storage pattern DSPr, which is interposed between the vertical semiconductor pattern VSP and each of the semiconductor layers 100. The remaining data storage pattern DSPr may be provided in each of the semiconductor layers 100, and the vertical semiconductor pattern VSP may be spaced apart from each of the semiconductor layers 100 by the remaining data storage pattern DSPr. The vertical semiconductor pattern VSP may be electrically separated from each of the semiconductor layers 100 by the remaining data storage pattern DSPr. The remaining data storage pattern DSPr may be interposed between the bottom surface VSP_B of the vertical semiconductor pattern VSP and each of the semiconductor layers 100 and may be extended onto the side surface of the vertical semiconductor pattern VSP. The remaining data storage pattern DSPr may have a U-shape. The data storage pattern DSP may be vertically spaced apart from the remaining data storage pattern DSPr. For example, the data storage pattern DSP may be spaced apart from the remaining data storage pattern DSPr by the vertical portion SP of the first source conductive pattern SCP1.

A topmost surface DPSr_U of the remaining data storage pattern DSPr may be positioned at a height lower than the top surface 100U of each of the semiconductor layers 100. The remaining data storage pattern DSPr may be vertically spaced apart from the data storage pattern DSP, with the vertical portion SP of the first source conductive pattern SCP1 interposed therebetween. The topmost surface DPSr_U of the remaining data storage pattern DSPr may be in contact with the vertical portion SP of the first source conductive pattern SCP1. The remaining data storage pattern DSPr may have substantially the same layer structure as that of the data storage pattern DSP. For example, the remaining data storage pattern DSPr may include a remaining charge storing layer 320r between the vertical semiconductor pattern VSP and each of the semiconductor layers 100, a remaining blocking insulating layer 310r between each of the semiconductor layers 100 and the remaining charge storing layer 320r, and a remaining tunnel insulating layer 330r between the vertical semiconductor pattern VSP and the remaining charge storing layer 320r. Each of the remaining charge storing layer 320r, the remaining blocking insulating layer 310r, and the remaining tunnel insulating layer 330r may include the same material as a corresponding one of the charge storing layer 320, the blocking insulating layer 310, and the tunnel insulating layer 330.

Each of the vertical structures VS may include an insulating pattern 150 filling an internal space of the vertical semiconductor pattern VSP. The insulating pattern 150 may include, for example, silicon oxide. Each of the vertical structures VS may include a conductive pad 160 disposed on the vertical semiconductor pattern VSP. The conductive pad 160 may cover a top surface of the insulating pattern 150 and a topmost surface of the vertical semiconductor pattern VSP. The conductive pad 160 may include doped semiconductor materials and/or conductive materials. The data storage pattern DSP may be extended from the side surface of the vertical semiconductor pattern VSP onto a side surface of the conductive pad 160. The data storage pattern DSP may enclose the side surface of the conductive pad 160, and a topmost surface of the data storage pattern DSP may be substantially coplanar with a top surface of the conductive pad 160.

Referring back to FIGS. 4 and 5, each of the cell array structures CS may include a plurality of electrode isolation structures GIS penetrating the source structure SC and the electrode structure ST. The electrode isolation structures GIS may be disposed on the cell array region CAR of each of the semiconductor layers 100 and may be extended onto the connection region CNR of each of the semiconductor layers 100. The electrode isolation structures GIS may have a line shape extending in the second direction D2 and may be spaced apart from each other in the first direction D1. Each of the electrode isolation structures GIS may be extended in the third direction D3 to penetrate the electrode structure ST and the source structure SC and may be coupled to a corresponding one of the semiconductor layers 100. In exemplary embodiments of the inventive concept, each of the electrode isolation structures GIS may include a common. source plug CSP, which is extended in the third direction D3, and a side surface insulating spacer SSP, which is extended along a side surface of the common source plug CSP or in the third direction D3. The common source plug CSP may penetrate the electrode structure ST and the source structure SC and may be coupled to each of the semiconductor layers 100. The side surface insulating spacer SSP may be interposed between the electrode structure ST and the common source plug CSP and may be extended into a region between the source structure SC and the common source plug CSP. The common source plug CSP may include a conductive material, and the side surface insulating spacer SSP may include, for example, silicon nitride.

An isolation structure IS may be disposed on the buried insulating layer 105 between the semiconductor layers 100. The isolation structure IS may have a line shape extending in a direction (e.g., the first direction 131), which is parallel to the top surface 1U of the semiconductor substrate 1. The isolation structure IS may be extended in the third direction D3, between the cell array structures CS, and may penetrate the first capping insulating layer 122, the insulating planarization layer 120, and the second insulating layer 109. The isolation structure IS may be interposed between the source structures SC of the cell array structures CS. The source structures SC of the cell array structures CS may be in contact with a side surface ISS of the isolation structure IS and may be electrically separated from each other by the isolation structure IS. For example, the isolation structure IS may be interposed between the second source conductive patterns SCP2 of the cell array structures CS. The second source conductive patterns SCP2 of the cell array structures CS may be in contact with the side surface IS_S of the isolation structure IS and may be electrically isolated from each other by the isolation structure IS. The isolation structure IS may penetrate the first insulating layer 107 and may be in contact with the buried insulating layer 105. A bottom surface IS_B of the isolation structure IS may be in contact with the buried insulating layer 105. A top surface IS_U of the isolation structure IS may be positioned at substantially the same height as top surfaces GIS_U of the electrode isolation structures GIS. In the present specification, the height may mean a distance from the top surface 1U of the semiconductor substrate 1.

The isolation structure IS may include the same material as the electrode isolation structures GIS, In exemplary embodiments of the inventive concept, the isolation structure IS may include a conductive pattern 200, which is extended in the third direction D3, and an insulating spacer 210, which is extended along a side surface of the conductive pattern 200 or in the third direction D3. The conductive pattern 200 may penetrate the first capping insulating layer 122, the insulating planarization layer 120, and the second insulating layer 109 and may be interposed between the source structures SC of the cell array structures CS. The conductive pattern 200 may penetrate the first insulating layer 107 and may be in contact with the buried insulating layer 105. The insulating spacer 210 may be interposed between the first capping insulating layer 122 and the conductive pattern 200, between the insulating planarization layer 120 and the conductive pattern 200, and between the second insulating layer 109 and the conductive pattern 200, and may be extended into a region between each of the source structures SC of the cell array structures CS and the conductive pattern 200. The insulating spacer 210 may be extended into a region between the first insulating layer 107 and the conductive pattern 200 and may be in contact with the buried insulating layer 105. The conductive pattern 200 may include the same material as the common source plug CSP, and the insulating spacer 210 may include the same material as the side surface insulating spacer SSP.

A second capping insulating layer 170 may be disposed to cover a top surface of the electrode structure ST and a top surface of the first capping insulating layer 122. The isolation structure IS and each of the electrode isolation structures GIS may penetrate the second capping insulating layer 170, and a top surface of the second capping insulating layer 170 may be positioned at substantially the same height as the top surface IS_U of the isolation structure IS and the top surfaces GIS_U of the electrode isolation structures GIS. An interlayered insulating layer 180 may be provided on the second capping insulating layer 170 to cover the top surface IS_U of the isolation structure IS and the top surfaces GIS_U of the electrode isolation structures GIS. The second capping insulating layer 170 and the interlayered insulating layer 180 may be formed of or include an insulating material (e.g., silicon oxide).

A contact plug 185 may be provided to penetrate the second capping insulating layer 170 and the interlayered insulating layer 180 and may be connected to the conductive pad 160, The contact plug 185 may be formed of or include a conductive material. Bit lines BL may be provided on the interlayered insulating layer 180 to extend in the first direction D1 and may be spaced apart from each other in the second direction D2. At least one of the vertical structures VS may be a dummy vertical structure, which is not connected to the contact plug 185. The vertical semiconductor pattern VSP of each of the vertical structures VS, except the dummy vertical structure, may be electrically connected to a corresponding one of the bit lines BL through the contact plug 185. The bit lines BL may include a conductive material. The top surface IS_U of the isolation structure IS may be positioned at a height higher than the top surfaces VS_U of the vertical structures VS (e.g., the top surface of the conductive pad 160) and may be positioned at a height lower than bottom surfaces BL_L of the bit lines BL. Conductive contacts and conductive lines may be connected to the electrode pads of the gate electrodes EGE, GGE, CGE, and SGE. In the case where an erase voltage is applied to the source structure SC during an erase operation on the memory cell array of FIG. 3, a gate-induced leakage current may occur in the erase control transistor ECT of FIG. 3. Thus, the erase operation may be effectively performed on the memory cells of FIG. 3.

FIGS. 8 to 19 are sectional views, which are taken along the line I-I' of FIG. 4 to illustrate a method of fabricating a three-dimensional semiconductor memory device, according to an exemplary embodiment of the inventive concept. For convenience, an element previously described with reference to FIGS. 4 to 7 may be identified by the same reference number without repeating an overlapping description thereof.

Figure 8:
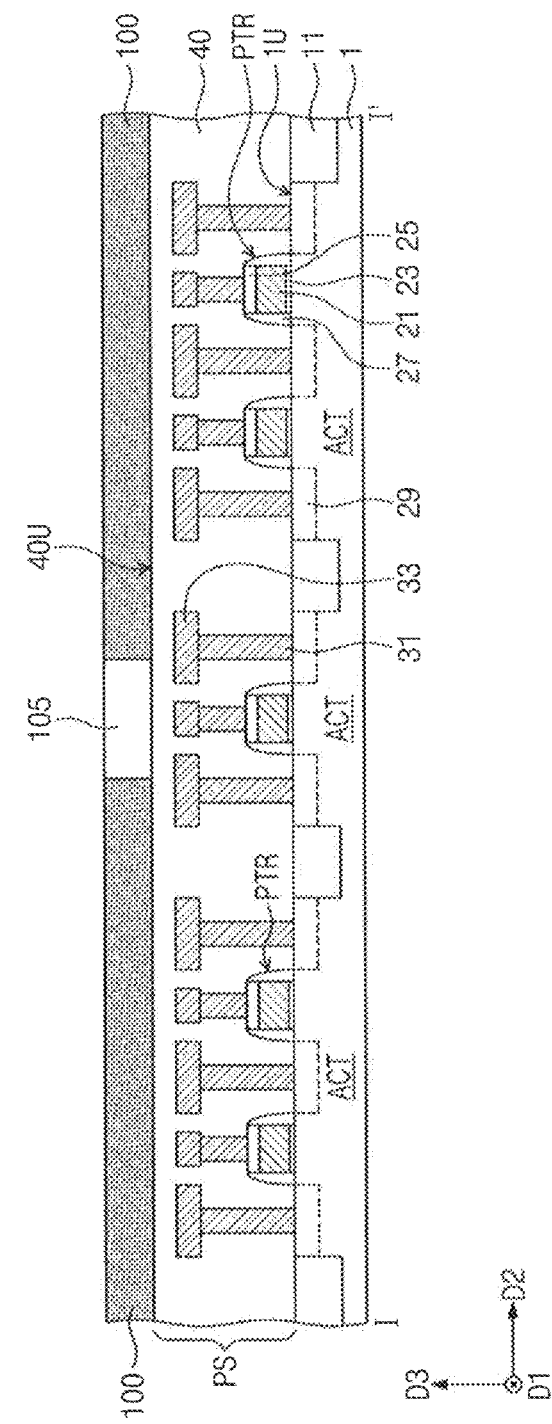
FIGS. 8, 9, 10A, 10B, 11, 12, 13, 14, 15, 16, 17, 18 and 19 are sectional views, which are taken along the line I-I' of FIG. 4 to illustrate a method of fabricating a three-dimensional semiconductor memory device, according to an exemplary embodiment the inventive concept.

Referring to FIGS. 4 and 8, the semiconductor substrate 1 may be prepared. The semiconductor substrate 1 may include the chip regions 10 and the scribe line region 20, as described with reference to FIG. 1. Peripheral circuit structure PS may be formed on each of the chip regions 10 of the semiconductor substrate 1. The peripheral circuit structure PS may include peripheral circuits, which are integrated on the semiconductor substrate 1, and a lower insulating layer 40 covering the peripheral circuits. The peripheral circuits may include peripheral transistors PTR, peripheral circuit interconnection lines 33, and peripheral contact plugs 31. In this case, the peripheral circuit interconnection lines 33 and the peripheral contact plugs 31 may be connected to the peripheral transistors PTR.

First, a device isolation layer 11 may be formed in the semiconductor substrate 1 to define an active region ACT. In an exemplary embodiment of the inventive concept, the formation of the peripheral transistors PTR may include forming a peripheral gate insulating layer 23, a peripheral gate electrode 21, and a peripheral gate capping pattern 25, which are sequentially stacked, on the active region ACT of the semiconductor substrate 1, forming peripheral gate spacers 27 on both side surfaces of the peripheral gate electrode 21, and injecting impurities into portions of the semiconductor substrate 1 at both sides of the peripheral gate electrode 21 to form peripheral source/drain regions 29. The peripheral contact plugs 31 may be electrically connected to the peripheral source/drain regions 29 of the peripheral transistors PTR, and the peripheral circuit interconnection lines 33 may be connected to the peripheral contact plugs 31. The lower insulating layer 40 may be formed on the semiconductor substrate 1 to cover the peripheral transistors PTR, the peripheral circuit interconnection lines 33, and the peripheral contact plugs 31. The lower insulating layer 40 may have a planarized or flat top surface 40U and may be patterned to expose a top surface of an edge of the semiconductor substrate 1 of FIG. 1.

Semiconductor layers 100 may be respectively formed on the chip regions 10 of the semiconductor substrate 1. The semiconductor layers 100 may be formed on the lower insulating layer 40 to be horizontally spaced apart from each other. The semiconductor layers 100 may be spaced apart from each other in a direction (e.g., the first and second directions D1 and D2 of FIG. 2), which is parallel to the top surface 1U of the semiconductor substrate 1, and bottom surfaces of the semiconductor layers 100 may be in contact with the lower insulating layer 40. For example, bottom surfaces of the semiconductor layers 100 may directly contact the lower insulating layer 40. The formation of the semiconductor layers 100 may include depositing a semiconductor layer on the lower insulating layer 40 and patterning the semiconductor layer. As a result of the patterning of the semiconductor layer, the semiconductor layers 100 may be locally formed on the top surface 40U of the lower insulating layer 40, and the top surface 40U of the lower insulating layer 40 may be partially exposed through gap regions between the semiconductor layers 100.

A buried insulating layer 105 may be formed on the lower insulating layer 40 and between the semiconductor layers 100. The buried insulating layer 105 may fill the gap regions between the semiconductor layers 100 and cover the exposed top surface 40U of the lower insulating layer 40. The buried insulating layer 105 may have a planarized top surface and may be patterned to expose the top surface of the edge of the semiconductor substrate 1 shown in FIG. 1.

Figure 9:
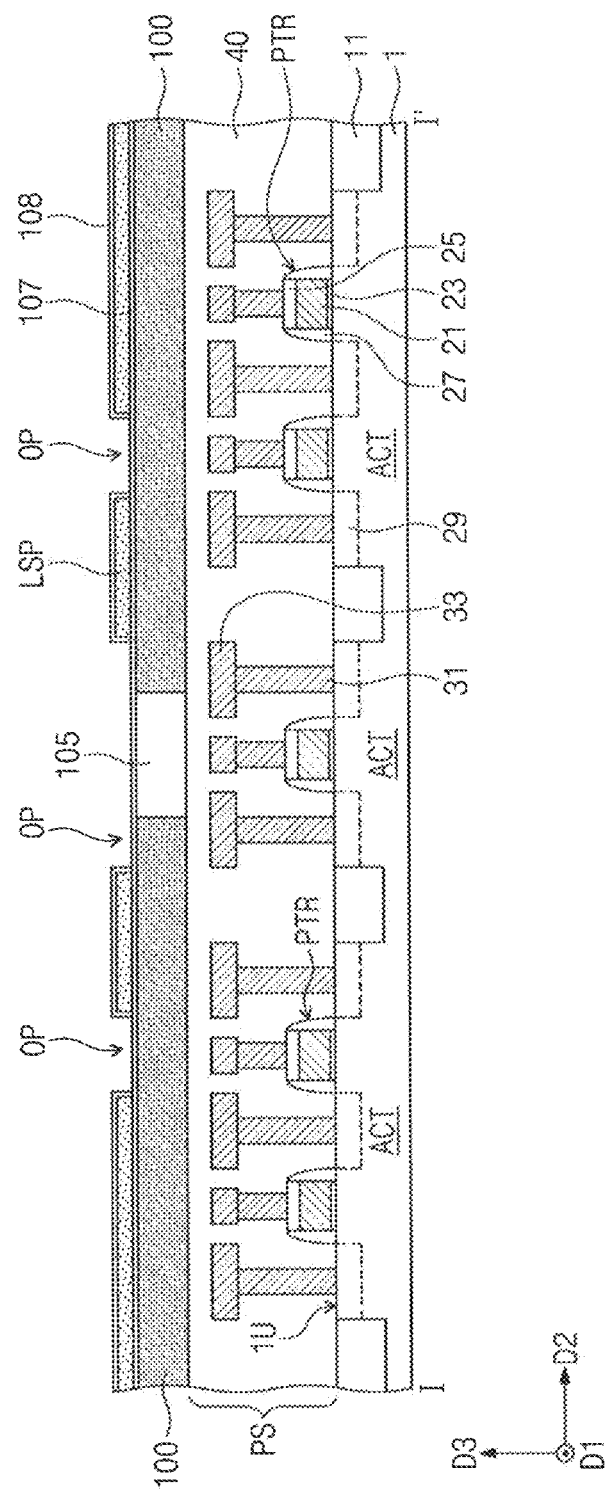

Referring to FIGS. 4 and 9, a first insulating layer 107 may be formed to cover top surfaces of the semiconductor layers 100 and the buried insulating layer 105. The first insulating layer 107 may be patterned to expose the top surface of the edge of the semiconductor substrate 1 shown in FIG. 1. A lower sacrificial pattern LSP may be formed on the first insulating layer 107. The lower sacrificial pattern LSP may be locally formed on the semiconductor layers 100. The formation of the lower sacrificial pattern LSP may include forming a lower sacrificial layer on the first insulating layer 107, forming a mask pattern on the lower sacrificial layer, and etching the lower sacrificial layer using the mask pattern as an etch mask to expose the first insulating layer 107. As a result of the etching process, the lower sacrificial pattern LSP may be formed to have openings OP exposing the first insulating layer 107. Some of the openings OP may be formed on the semiconductor layers 100 and may be vertically overlapped with the semiconductor layers 100, and others of the openings OP may be formed on the buried insulating layer 105 and may be vertically overlapped with the buried insulating layer 105. For example, some of the openings OP may overlap the semiconductor layers 100, while other openings OP overlap the buried insulating layer 105. The lower sacrificial pattern LSP may be formed of or include a material, which has an etch selectivity with respect to the first insulating layer 107. As an example, the lower sacrificial pattern LSP may include a silicon nitride layer, a silicon oxynitride layer, a silicon. carbide layer, or a silicon germanium layer.

A buffer insulating layer 108 may be formed to cover the lower sacrificial pattern LSP. The buffer insulating layer 108 may cover a top surface of the lower sacrificial pattern LSP and a side surface of the lower sacrificial pattern LSP, which is exposed by the openings OP, with a uniform thickness. In exemplary embodiments of the inventive concept, the buffer insulating layer 108 may be extended onto the first insulating layer 107, which is exposed by the openings OP. In this case, the buffer insulating layer 108 may be patterned to expose the top surface of the edge of the semiconductor substrate 1 shown in FIG. 1. The buffer insulating layer 108 may include, for example, a silicon oxide layer.

Figure 10A:
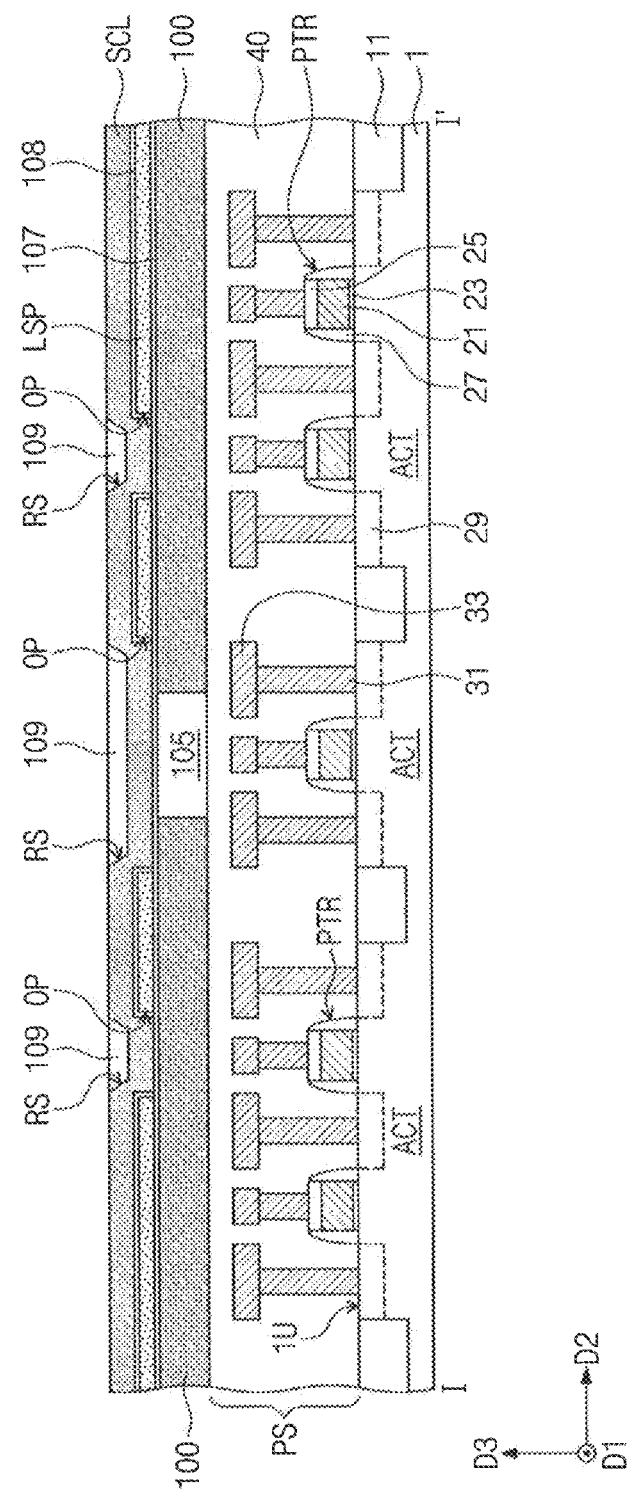
Figure 10B:
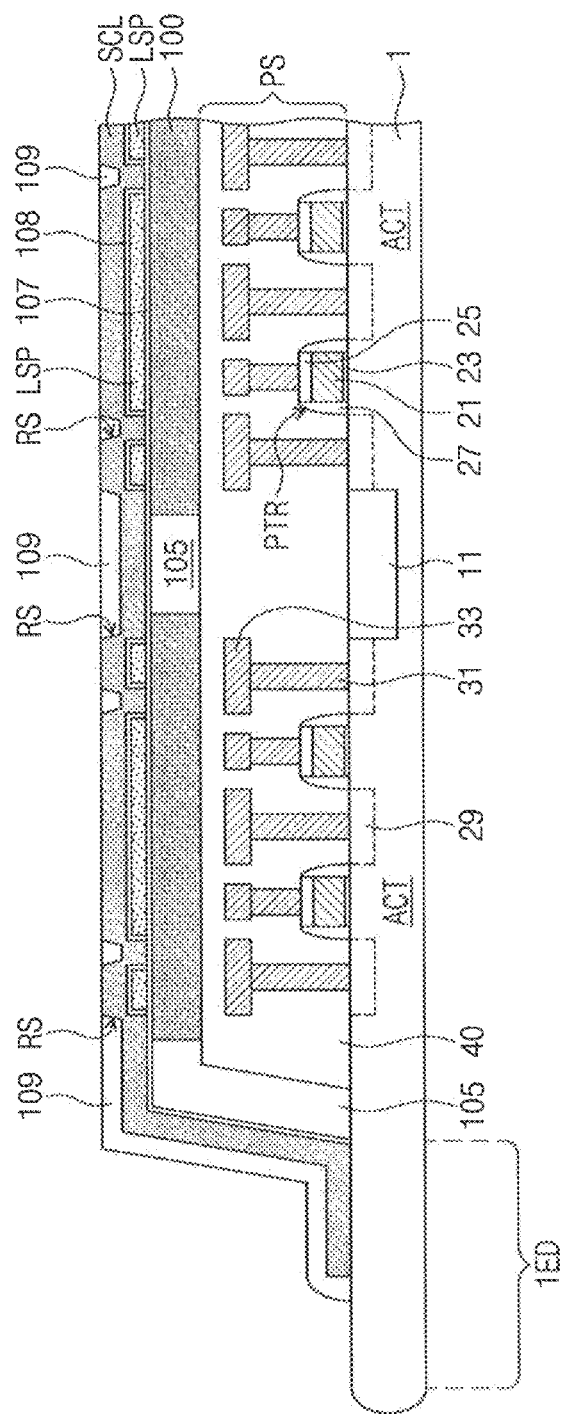

Referring to FIGS. 4, 10A, and 10B, a source conductive layer SCL may be formed to cover the top surface of the lower sacrificial pattern LSP and inner surfaces of the openings OP with a uniform thickness. Since the source conductive layer SCL covers the inner surfaces of the openings OP with a uniform thickness, the source conductive layer SCL may have top surfaces RS recessed toward the openings OP. In other words, the top surfaces RS, which are recessed, may overlap the openings OP. The source conductive layer SCL may be formed to cover the entire top surface of the semiconductor substrate 1 of FIG. 1. The source conductive layer SCL may be a single layer covering the semiconductor layers 100 and the buried insulating layer 105. The source conductive layer SCL, may cover the buried insulating layer 105 and the first insulating layer 107, which are adjacent to an edge 1ED of the semiconductor substrate 1 of FIG. 1, and may cover the top surface of the edge 1ED of the semiconductor substrate 1. At the edge 1ED of the semiconductor substrate 1, the source conductive layer SCL may be in direct contact with the semiconductor substrate 1.

Also at the edge 1ED, the semiconductor substrate 1 that is not covered by the source conductive layer SCL may be exposed. The source conductive layer SCL may include a doped semiconductor material or a metallic material. A second insulating layer 109 may be formed to cover the recessed top surfaces RS of the source conductive layer SCL. In other words, the second insulating layer 109 may be disposed in the recessed top surfaces RS of the source conductive layer SCL. The formation of the second insulating layer 109 may include forming the second insulating layer 109 on the source conductive layer SCL and planarizing the second insulating layer 109 to expose the source conductive layer SCL. The second insulating layer 109 may cover the source conductive layer SCL, which is adjacent to the edge 1ED of the semiconductor substrate 1.

Figure 11:
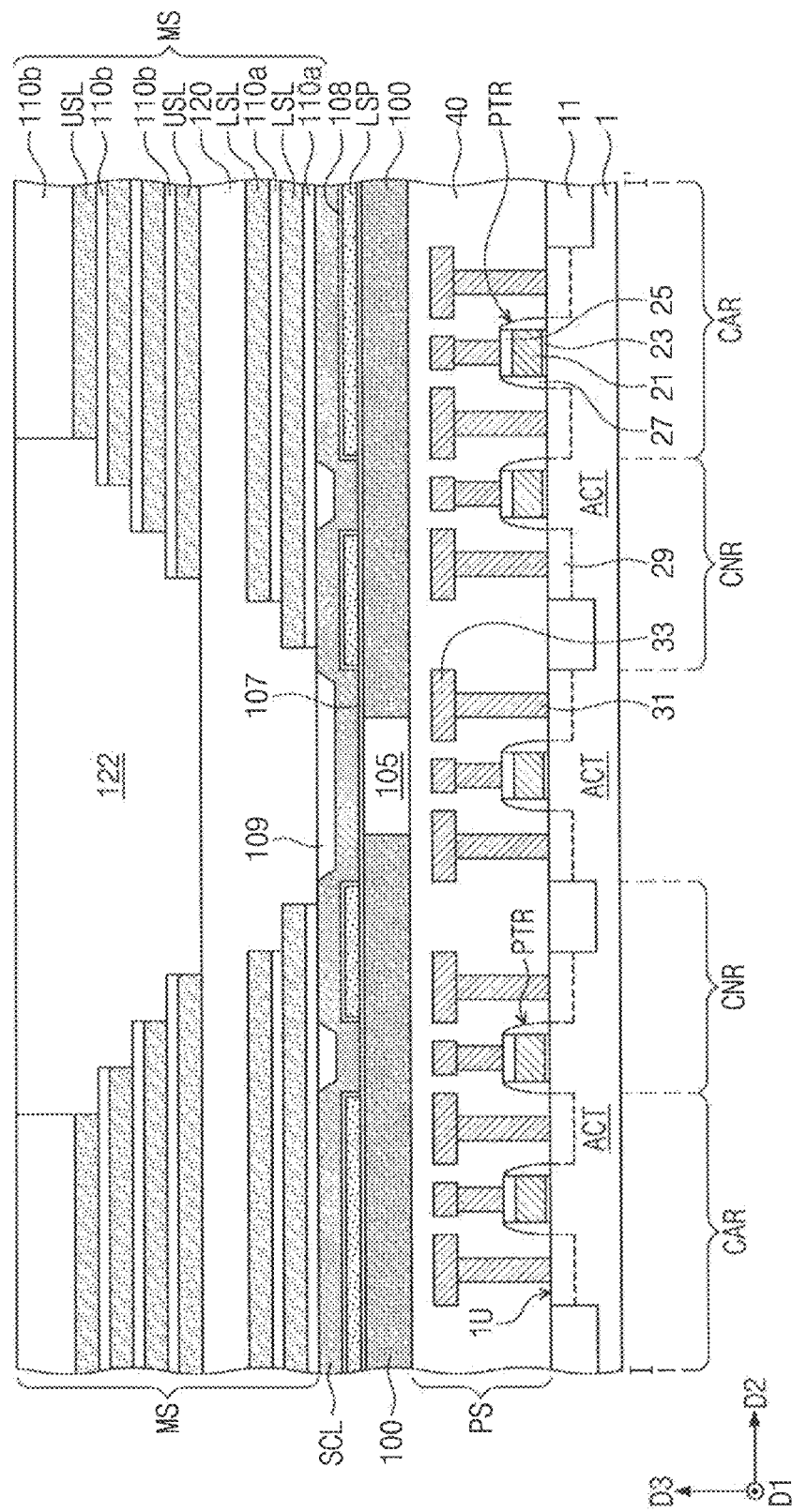

Referring to FIGS. 4 and 11, mold structures MS may be formed on the source conductive layer SCL. The mold structures MS may be formed on the semiconductor layers 100, respectively. The formation of the mold structures MS may include alternately stacking lower insulating layers 110a and lower sacrificial layers LSL on the source conductive layer SCL, forming an insulating planarization layer 120 on the topmost layer of the lower sacrificial layers LSL and alternately stacking upper insulating layers 110b and upper sacrificial layers USL on the insulating planarization layer 120. The lower sacrificial layers LSL may include a material having an etch selectivity with respect to the lower insulating layers 110a, and the insulating planarization layer 120 may be formed to be thicker than the lower insulating layers 110a. The upper sacrificial layers USL may include a material having an etch selectivity with respect to the upper insulating layers 110b. In exemplary embodiments of the inventive concept, the upper sacrificial layers USL may include the same material as the lower sacrificial layers LSL and the lower sacrificial pattern LSP. As an example, the upper and lower sacrificial layers USL and LSL may include a silicon nitride layer, and the upper and lower insulating layers 110b and 110a may include a silicon oxide layer.

Each of the semiconductor layers 100 may include a cell array region CAR and a connection region CNR. Each of the mold structures MS may be extended from the cell array region CAR of each of the semiconductor layers 100 to the connection region CNR and may have a stepwise end portion on the connection region CNR. The lower insulating layers 110a, the lower sacrificial layers LSL, the upper sacrificial layers USL, and the upper insulating layers 110b may be patterned, such that each of the mold structures MS has the stepwise end portion on the connection region CNR. The insulating planarization layer 120 may cover the lower insulating layers 110a and the lower sacrificial layers LSL, which are patterned, and may be extended onto the buried insulating layer 105 between the semiconductor layers 100. The buried insulating layer 105 may be disposed between the stepwise end portions of adjacent mold structures MS. A first capping insulating layer 122 may be formed to cover the stepwise end portion of the mold structure MS. The first capping insulating layer 122 may be extended onto the buried insulating layer 105 between the semiconductor layers 100 to cover the insulating planarization layer 120.

Figure 12:
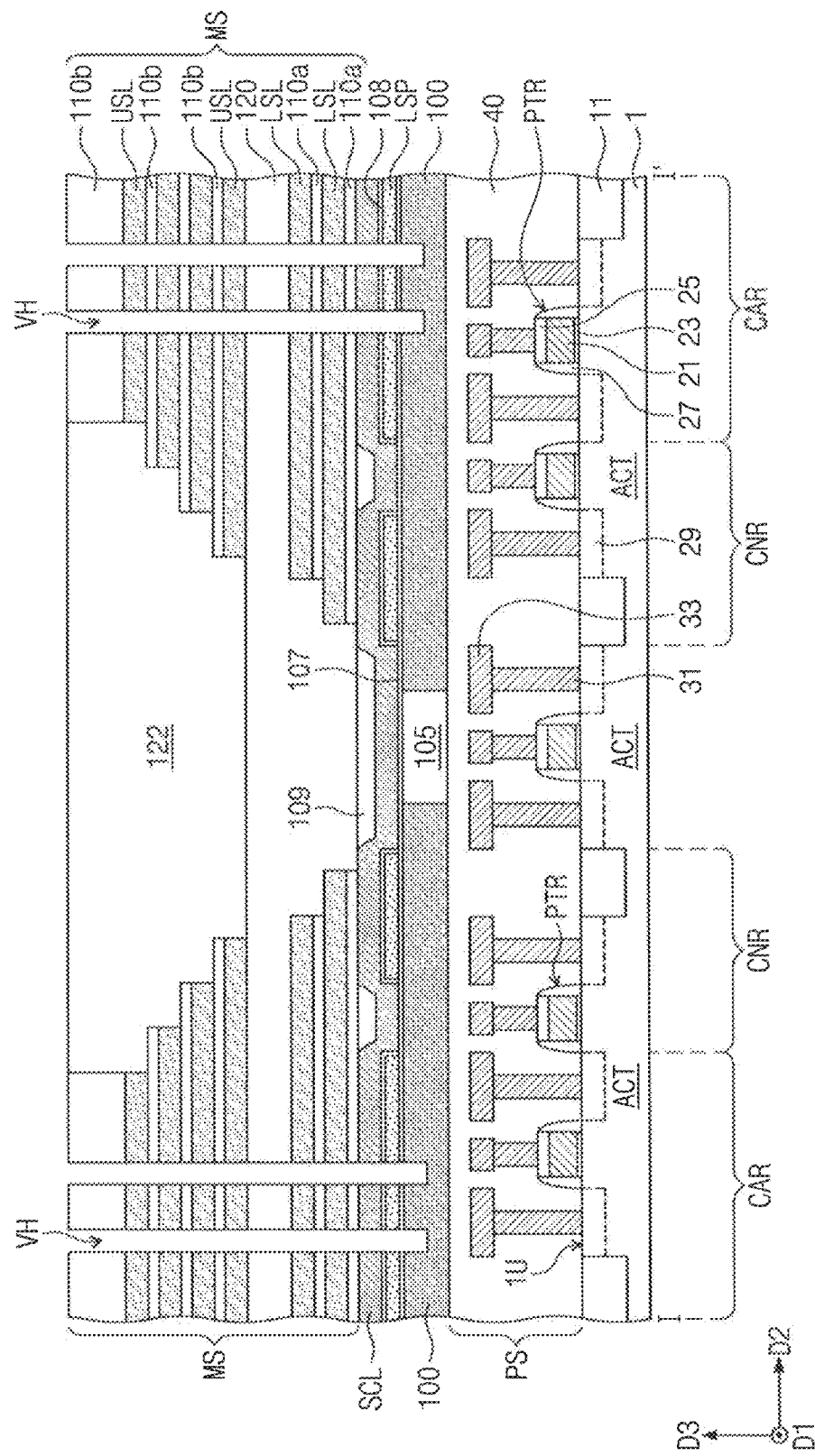

Referring to FIGS. 4 and 12, a plurality of vertical holes VH may be formed in each of the mold structures MS. The vertical holes H may be formed on the cell array region CAR of each of the semiconductor layers 100. In an exemplary embodiment of the inventive concept, the vertical holes VH may he arranged to form a zigzag shape in the second direction D2. Each of the vertical holes VH may penetrate the mold structure MS, the source conductive layer SCL, the buffer insulating layer 108, the lower sacrificial pattern LSP, and the first insulating layer 107 and expose a corresponding one of the semiconductor layers 100.

The formation of the vertical holes VH may include performing an anisotropic etching process to etch the mold structure MS, the source conductive layer SCL, the buffer insulating layer 108, the lower sacrificial pattern LSP, and the first insulating layer 107, In an exemplary embodiment of the inventive concept, the anisotropic etching process may be a plasma etching process, a reactive ion etching (RIE) process, an inductively coupled plasma reactive ion etching (ICP-RIE) process, or an ion beam etching (IBE) process. In the anisotropic etching process, positive charges, such as ions and/or radicals, away be produced by plasma. In the case where the positive charges are accumulated in the semiconductor layers 100, arcing may occur in the semiconductor layers 100.

According to an exemplary embodiment of the inventive concept, the source conductive layer SCL may be a single layer covering the semiconductor layers 100 and the buried insulating layer 105 and may be in direct contact with the semiconductor substrate 1 at the edge 1ED of the semiconductor substrate 1, as shown in FIG. 10B. During the anisotropic etching process to form the vertical holes VH, a ground voltage may be applied to the semiconductor substrate 1. Thus, the positive charges, which are produced during the anisotropic etching process, may be discharged to the semiconductor substrate 1 through the source conductive layer SCL. Thus, it is possible to prevent the positive charges, which are produced during the anisotropic etching process, from being accumulated in the semiconductor layers 100 and causing arcing in the semiconductor layers 100.

Figure 13:
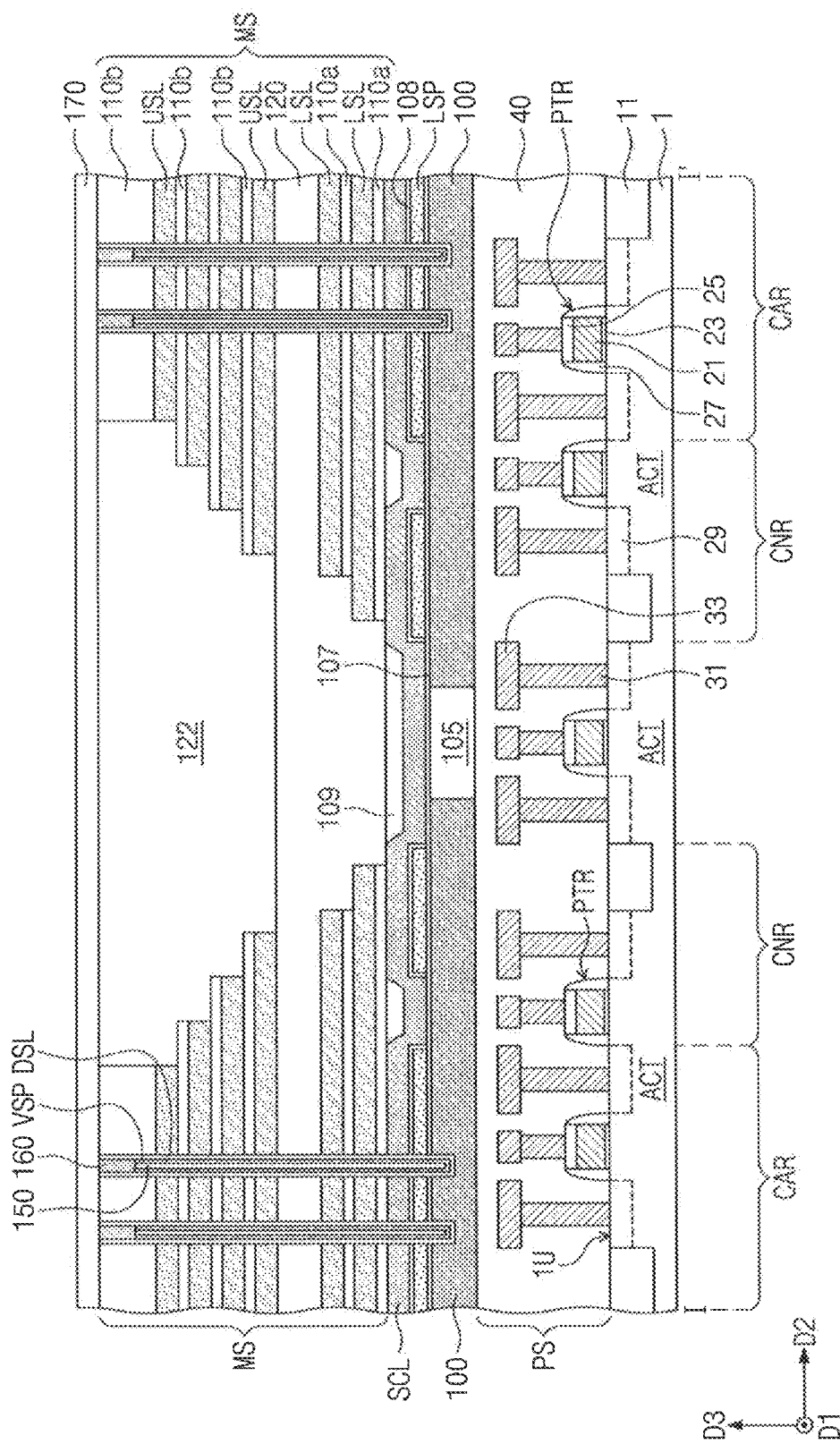

Referring to FIGS. 4 and 13, a data storage layer DSL, a vertical semiconductor pattern VSP, an insulating pattern 150, and a conductive pad 160 may be formed in each of the vertical holes VH. The data storage layer DSL may fill a portion of each of the vertical holes VH and cover an inner surface of each of the vertical holes VH with a uniform thickness. The vertical semiconductor pattern VSP may fill a portion of each of the vertical holes VH and cover the inner surface of each of the vertical holes VH with a uniform thickness. The data storage layer DSL may be interposed between the inner surface of each of the vertical holes VH and the vertical semiconductor pattern VSP. The insulating pattern 150 may fill a portion of each of the vertical holes VH or an inner space of the vertical semiconductor pattern VSP. The vertical semiconductor pattern VSP may be interposed between the data storage layer DSL and the insulating pattern 150. The conductive pad 160 may fill a remaining empty portion of each of the vertical holes VH. The conductive pad 160 may cover a top surface of the insulating pattern 150 and a topmost surface of the vertical semiconductor pattern VSP. The data storage layer DSL may be interposed between the inner surface of each of the vertical holes VH and the conductive pad 160. A second capping insulating layer 170 may be formed on the mold structures MS to cover a top surface of the conductive pad 160. The second capping insulating layer 170 may be extended from the semiconductor layers 100 onto the buried insulating layer 105 to cover a top surface of the first capping insulating layer 122.

Figure 14:
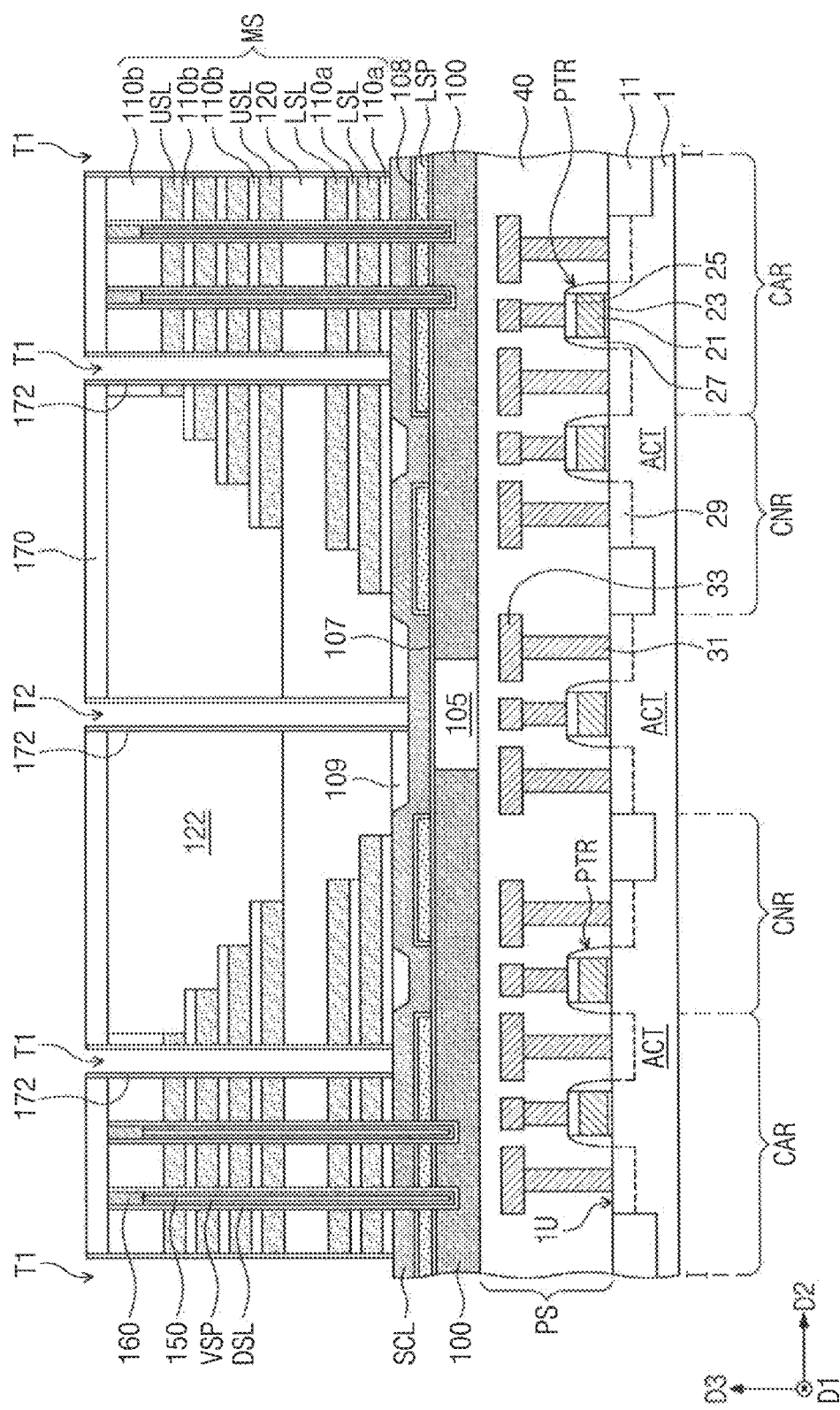

Referring to FIGS. 4 and 14, first trenches T1 may be formed to penetrate the second capping insulating layer 170 and each of the mold structures MS to expose the source conductive layer SCL. The first trenches T1 may he extended in the second direction D2 and may he spaced apart from each other in the first direction D1. The first trenches T1 may correspond to the electrode isolation structures GIS shown in FIG. 4. The first trenches T1 may be disposed on the cell array region CAR of each of the semiconductor layers 100 and may be extended onto the connection region CNR of each of the semiconductor layers 100. A second trench T2 may be formed to penetrate the second capping insulating layer 170, the first capping insulating layer 122, the insulating planarization layer 120, and the second insulating layer 109 and to expose the source conductive layer SCL. The second trench T2 may overlap the buried insulating layer 105 between the semiconductor layers 100 and may have a line shape extending in the first direction D1, as shown by the isolation structure IS in FIG. 4. The first trenches T1 and the second trench T2 may be formed at the same time. As an example, the first and second trenches T1 and T2 may be formed concurrently through a single anisotropic etching process.

A sacrificial spacer 172 may be formed on an inner side surface of each of the first and second trenches T1 and T2. The sacrificial spacer 172 may fill a portion of each of the first and second trenches T1 and T2 and cover the inner side surface of each of the first and second trenches T1 and T2 with a uniform thickness. The sacrificial spacer 172 may include a material having an etch selectivity with respect to the mold structures MS. As an example, the sacrificial spacer 172 may include a polysilicon layer. The formation of the sacrificial spacer 172. may include forming a sacrificial spacer layer to cover an inner surface of each of the first and second trenches T1 and T2 with a uniform thickness and then anisotropically etching the sacrificial spacer layer.

Figure 15:
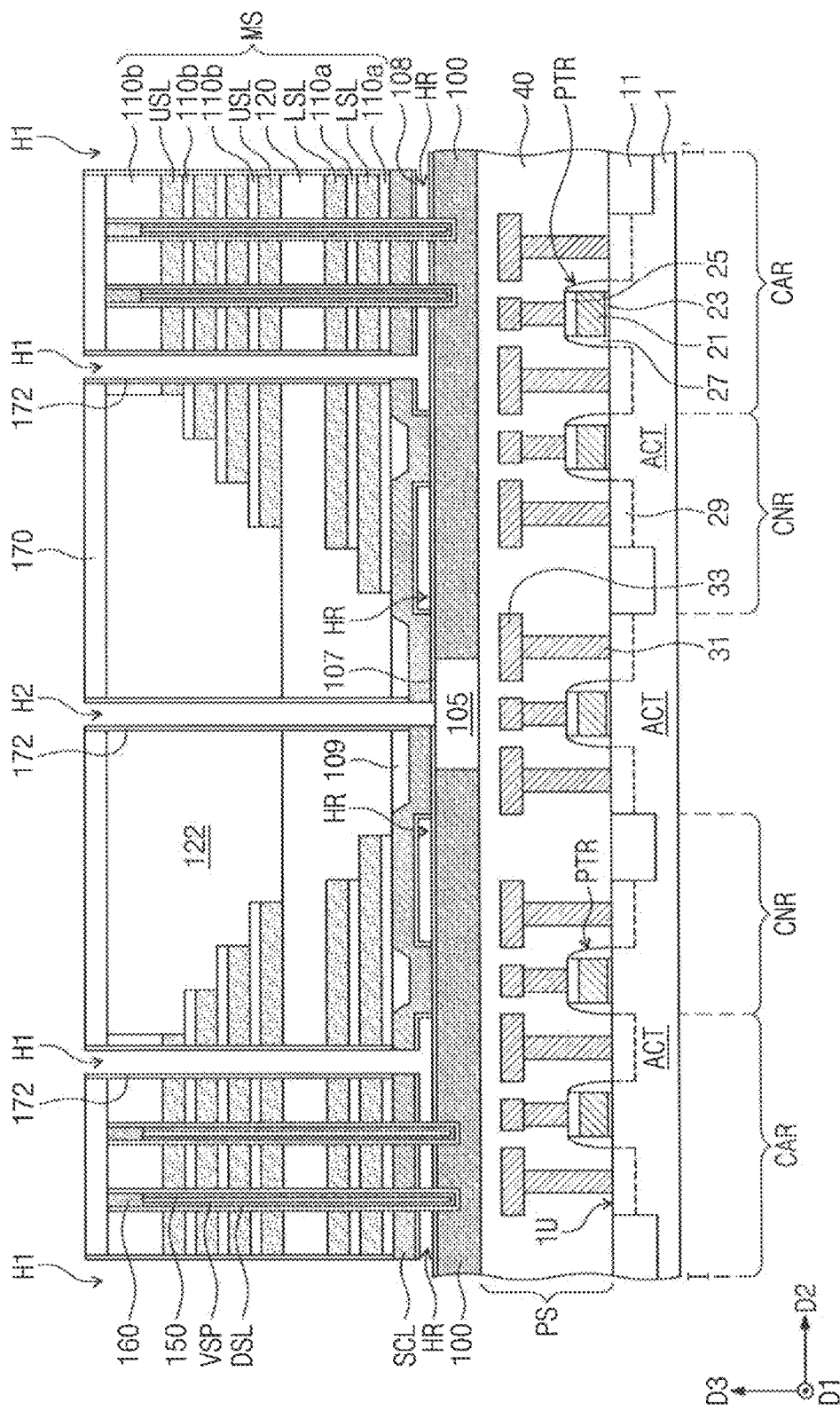

Referring to FIGS. 4 and 15, a portion of the source conductive layer SCL and a portion of the buffer insulating layer 108, which are exposed by each of the first trenches T1, may be etched. Thus, a first penetration hole H1 may be formed to expose the lower sacrificial pattern LSP in each of the first trenches T1. A portion of the source conductive layer SCL and a portion of the first insulating layer 107, which are exposed by the second trench T2, may be etched. Thus, a second penetration hole H2 may be formed to expose the buried insulating layer 105 in the second trench T2. The first penetration hole H1 and the second penetration hole H2 may be formed at the same time. As an example, the first penetration hole H1 and the second penetration hole H2 may be formed concurrently through a single anisotropic etching process. Thereafter, an isotropic etching process may he performed to remove the lower sacrificial pattern LSP exposed by the first penetration hole H1. Due to the removal of the lower sacrificial pattern LSP, a horizontal recess region HR may he formed. The horizontal recess region HR may expose a portion of a side surface of the data storage layer DSL.

Figure 16:
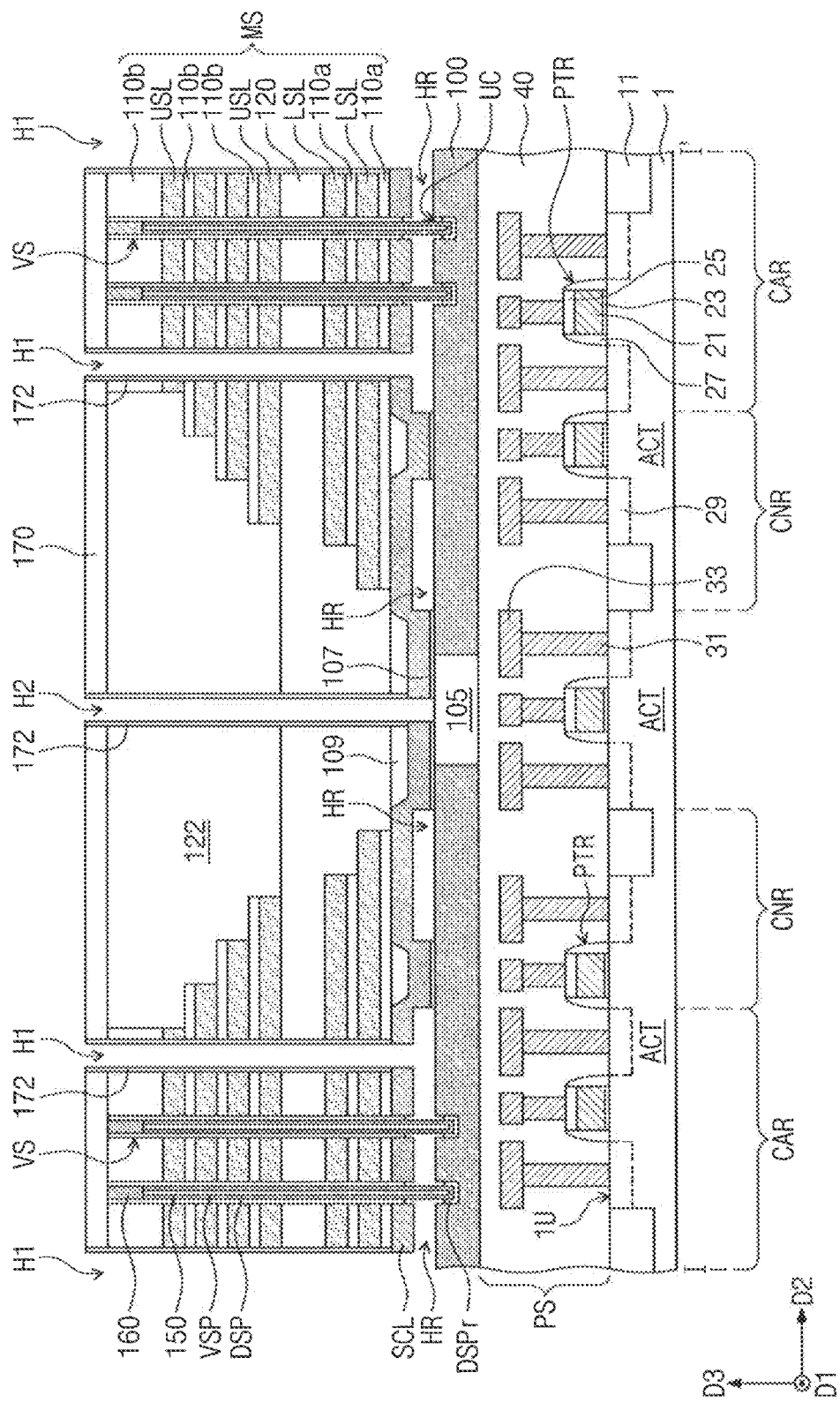

Referring to FIGS. 4 and 16, the portion of the data storage layer DSL exposed by the horizontal recess region HR may be removed, and thus, a portion of a side surface of the vertical semiconductor pattern VSP may be exposed. Since the portion of the data storage layer DSL is removed, the data storage layer DSL may be divided into a data storage pattern DSP and a remaining data storage pattern DSPr, which are vertically spaced apart from each other. In other words, the data storage pattern DSP and the remaining data storage pattern DSPr may be separated from each other. The remaining data storage pattern DSPr may be formed in a corresponding semiconductor layer of the semiconductor layers 100. The removal of the portion of the data storage layer DSL may include removing a portion of the first insulating layer 107 and a portion of the buffer insulating layer 108. Thus, a bottom surface of the source conductive layer SCL and a top surface of each of the semiconductor layers 100 may be exposed by the horizontal recess region HR. An undercut region UC may be formed by the partial removal of the data storage pattern DSP. The undercut region UC may be an empty region, which is vertically extended from the horizontal recess region HR. The undercut region UC may he extended into regions between the side surface of the vertical semiconductor pattern VSP and the source conductive layer SCL and between the side surface of the vertical semiconductor pattern VSP and the corresponding semiconductor layer 100. A bottom surface of the data storage pattern DSP and a topmost surface of the remaining data storage pattern DSPr may be disposed in the undercut region UC.

Figure 17:
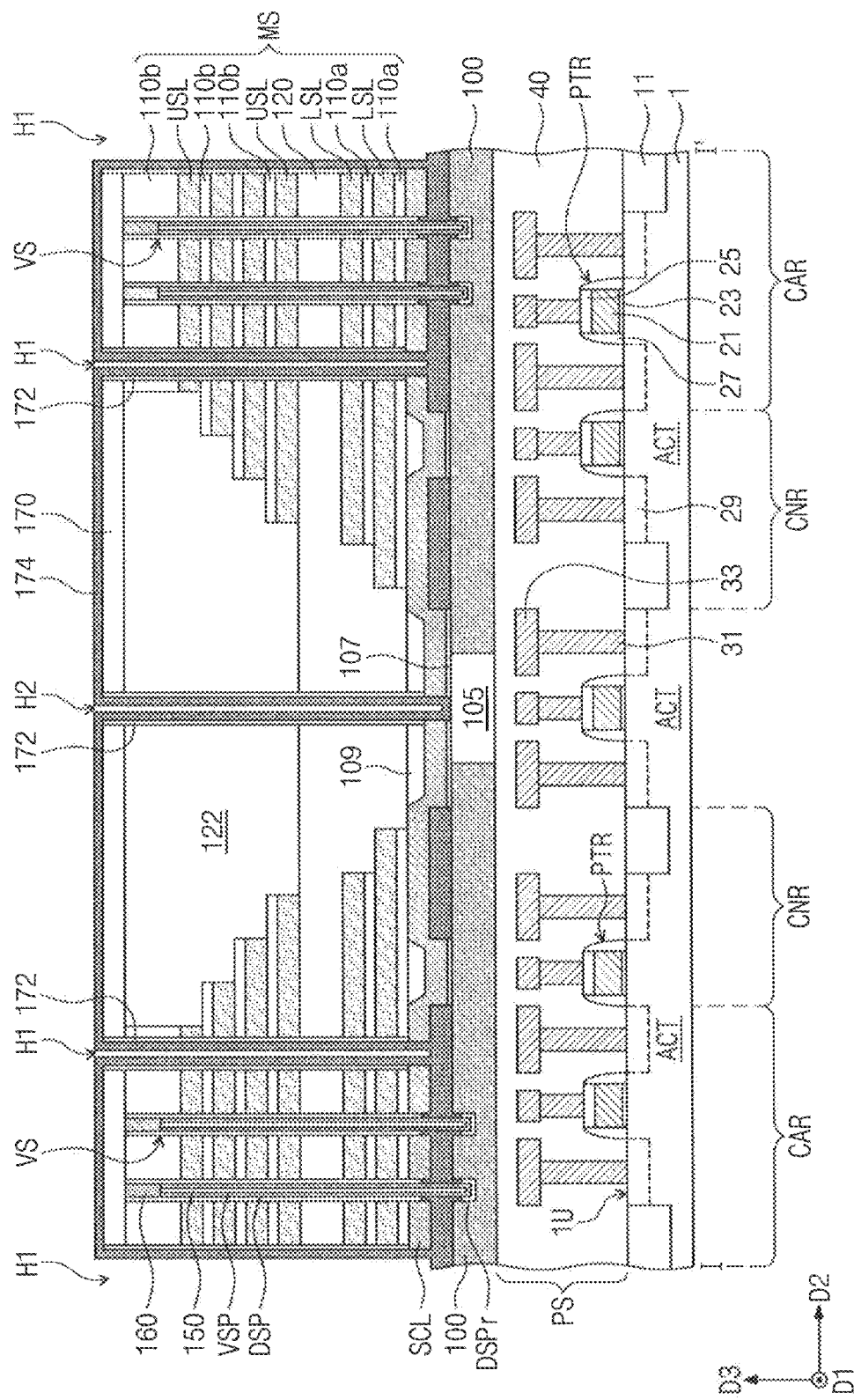

Referring to FIGS. 4 and 17, a sidewall conductive layer 174 may be formed to fill the undercut region UC and the horizontal recess region HR and to fill a portion of each of the first and second penetration holes H1 and H2. The sidewall conductive layer 174 may include a doped semiconductor material. The sidewall conductive layer 174 may cover an inner surface of each of the first and second penetration holes H1 and 112 with a uniform thickness and may not fill the entirety of each of the first and second penetration holes H1 and H2. The sidewall conductive layer 174 may be in direct contact with the side surface of the vertical semiconductor pattern VSP, the bottom surface of the source conductive layer SCL, and the top surfaces of the semiconductor layers 100.

Figure 18:
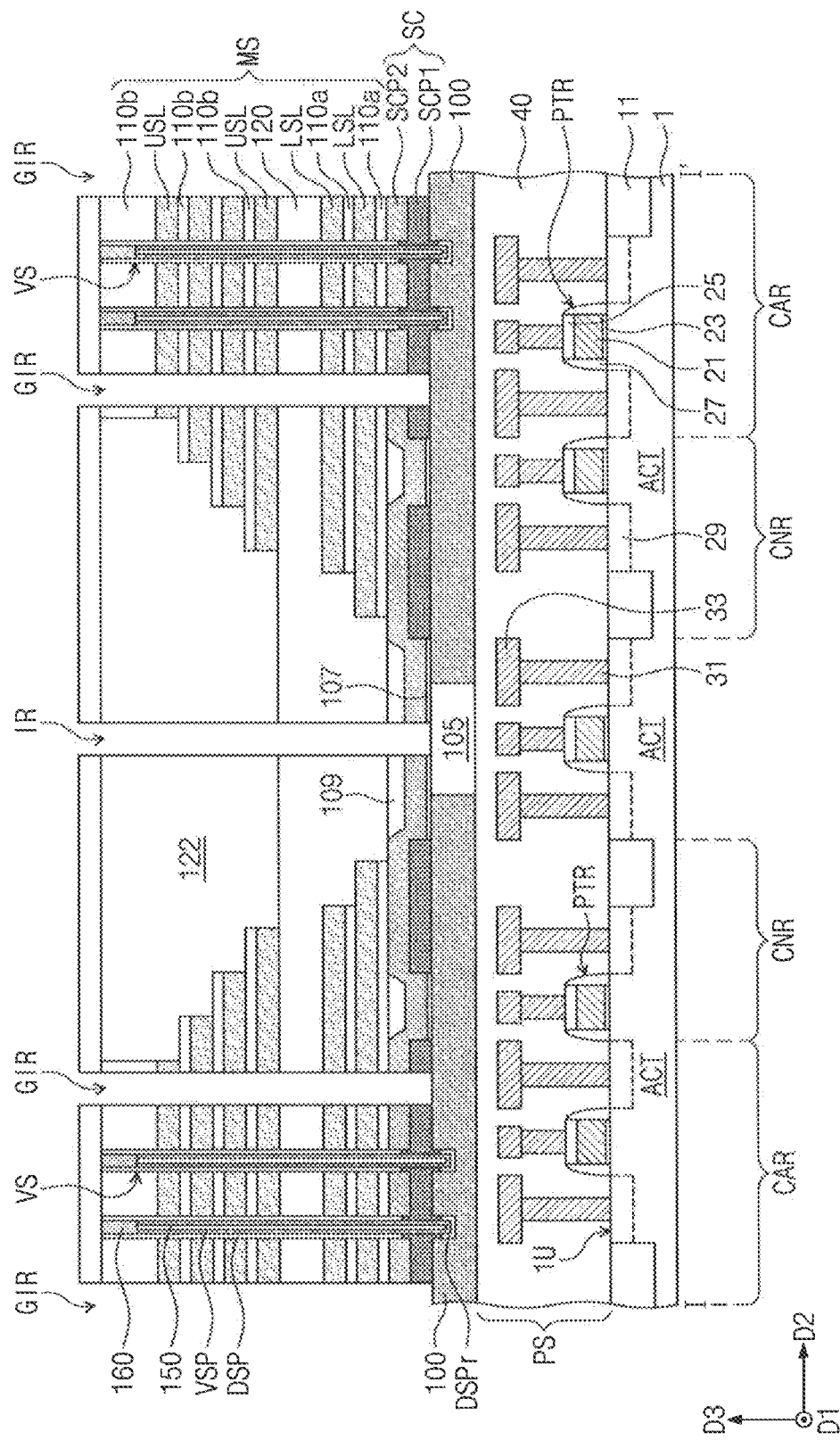

Referring to FIGS. 4 and 18, an isotropic etching process may be performed on the sidewall conductive layer 174 to form a first source conductive pattern SCP1 in the undercut region UC and the horizontal recess region HR. During the isotropic etching process on the sidewall conductive layer 174, the sacrificial spacer 172 in each of the first and second penetration holes H1 and H2 may he etched to form gate isolation regions GIR on each of the semiconductor layers 100 and to form an isolation region IR on the buried insulating layer 105 between the semiconductor layers 100. The gate isolation regions GIR may expose upper surfaces of the semiconductor layers 100 and the isolation region IR may expose an upper surface of the buried insulating layer 105. During the isotropic etching process on the sidewall conductive layer 174, the source conductive layer SCL may be etched to form a second source conductive pattern SCP2. The first source conductive pattern SCP1 and the second source conductive pattern SCP2 may constitute a source structure SC.

Each of the gate isolation regions GIR may penetrate a corresponding mold structure of the mold structures MS and the source structure SC below the corresponding mold structure MS and may expose a top surface of a corresponding semiconductor layer of the semiconductor layers 100. The isolation region IR may penetrate the second capping insulating layer 170, the first capping insulating layer 122, the insulating planarization layer 120, the second insulating layer 109, the second source conductive pattern SCP2, and the first insulating layer 107 and may expose a top surface of the buried insulating layer 105 between the semiconductor layers 100. The gate isolation regions GIR and the isolation region IR may be formed at the same time. As an example, the gate isolation regions GIR and the isolation region IR may be formed concurrently through a single etching process (e.g., the isotropic etching process on the sidewall conductive layer 174).

Figure 19:
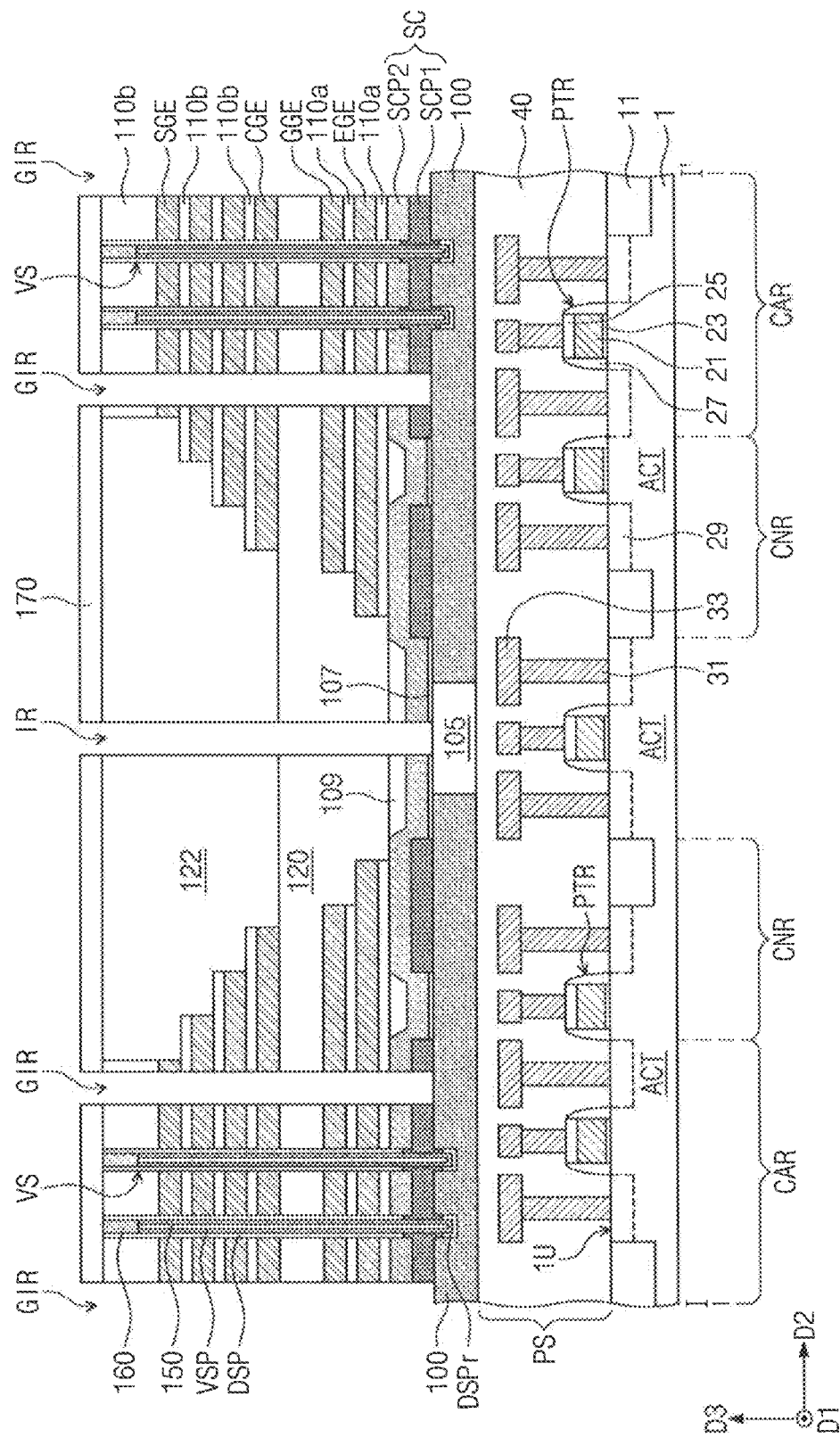

Referring to FIGS. 4 and 19, the lower and upper sacrificial layers LSL and USL exposed by the gate isolation regions GIR may be removed. Thus, gate regions may be formed between the lower insulating layers 110a and the upper insulating layers 110b. The formation of the gate regions may include performing an isotropic etching process to selectively etch the lower and upper sacrificial layers LSL and USL. Thereafter, gate electrodes EGE, GGE, CGE, and SGE may be formed to fill the gate regions.

Referring back to FIGS. 4 and 5, side surface insulating spacers SSP may be formed in the gate isolation regions GIR, respectively, and an insulating spacer 210 may be formed in the isolation region IR. The formation of the side surface insulating spacers SSP and the insulating spacer 210 may include forming an insulating spacer layer to fill a portion of each of the gate isolation regions GIR and the isolation region IR and anisotropically etching the insulating spacer layer. Due to the anisotropic etching process, the side surface insulating spacers SSP may be locally formed in the gate isolation regions GIR, respectively, and the insulating spacer 210 may be locally formed in the isolation region IR. Common source plugs CSP may be formed in the gate isolation regions GIR, respectively, and a conductive pattern 200 may he formed in the isolation region IR. The formation of the common source plugs CSP and the conductive pattern 200 may include forming a conductive layer to fill a remaining empty region of each of the gate isolation regions GIR and the isolation region IR and planarizing the conductive layer to expose the second capping insulating layer 170. Due to the planarization process, the common source plugs CSP may be locally formed in the gate isolation regions GIR, respectively, and the conductive pattern 200 may be locally formed in the isolation region IR. Each of the common source plugs CSP and each of the side surface insulating spacers SSP may constitute an electrode isolation structure GIS, and the conductive pattern 200 and the insulating spacer 210 may constitute an isolation structure IS.

An interlayered insulating layer 180 may be formed on the second capping insulating layer 170 to cover a top surface IS_U of the isolation structure IS and a top surfaces GIS_U of the electrode isolation structures GIS. A contact plug 185 may be formed to penetrate the second capping insulating layer 170 and the interlayered insulating layer 180 and may be connected to the conductive pad 160. Bit lines BL may be formed on the interlayered insulating layer 180, and the contact plug 185 may be connected to a corresponding bit line of the bit lines BL. In addition, conductive contacts and conductive lines may be formed to be connected to electrode pads of the gate electrodes EGE, GGE, CGE, and SGE.

Figure 20:
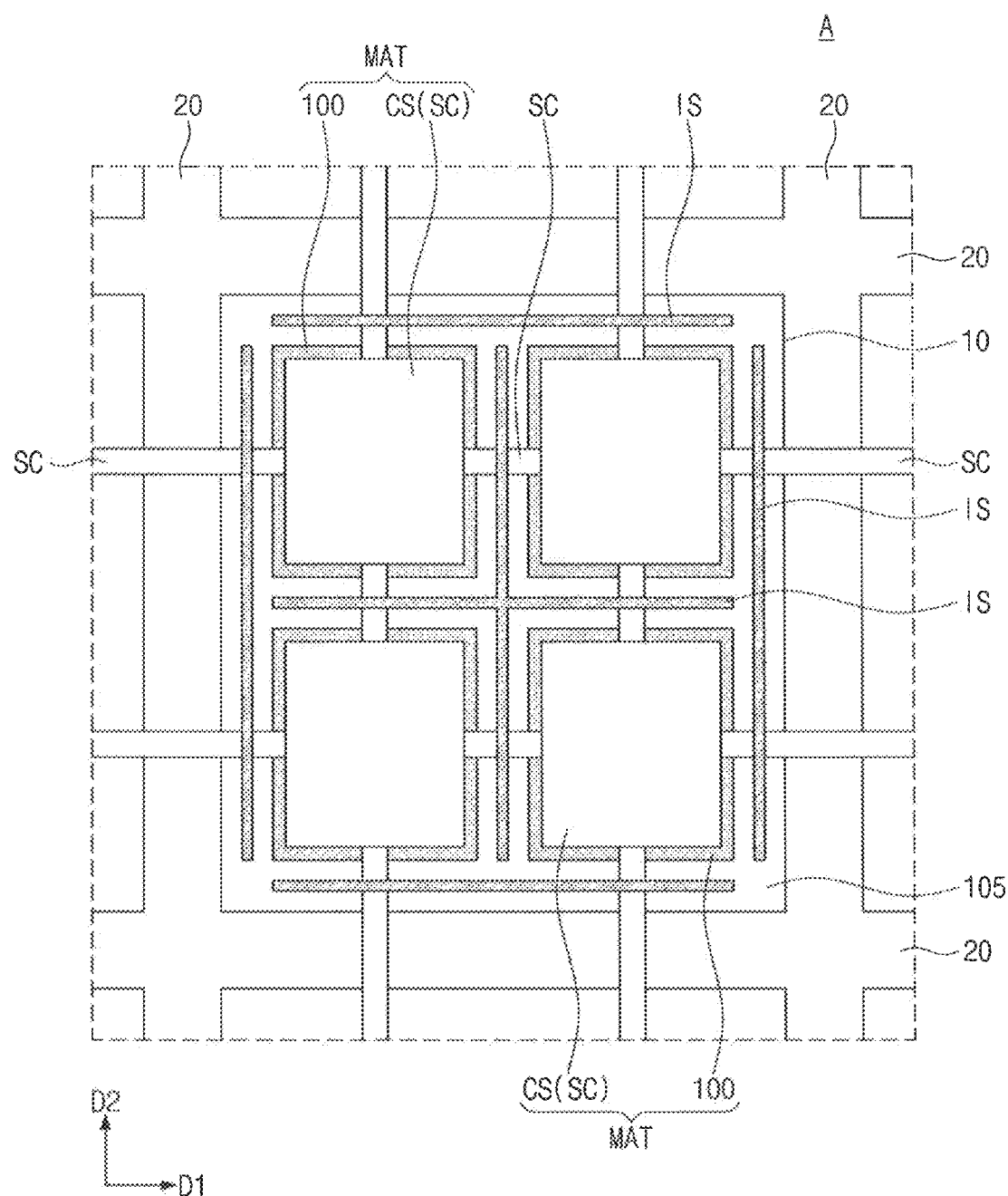
FIG. 20 is an enlarged plan view schematically illustrating a portion (e.g., the portion 'A' of FIG. 1) of a three-dimensional semiconductor memory device according to an exemplary embodiment of the inventive concept.

FIG. 20 is an enlarged plan view schematically illustrating a portion (e.g., the portion 'A' of FIG. 1) of a three-dimensional semiconductor memory device according to an exemplary embodiment of the inventive concept. For convenience, the description that follows will mainly refer to features different from that described with reference to FIGS. 1 to 7.

Referring to FIGS. 1 and 20, an isolation structure IS may be disposed on each of the chip regions 10 of the semiconductor substrate 1. The isolation structure IS may be disposed on the buried insulating layer 105 between the semiconductor layers 100. In the present embodiment, the isolation structure IS may be interposed between a first pair of the cell array structures CS, which are adjacent to each other in the first direction D1, and may be extended into a region between a second pair of the cell array structures CS, which are adjacent to each other in the second direction D2. Further, the isolation structure IS is also disposed between a third pair of the cell array structures CS, which are adjacent to each other in the first direction D1, and may be extended into a region between a fourth pair of the cell array structures CS, which are adjacent to each other in the second direction D2. The isolation structure IS may have a cross shape, when viewed in a plan view.

The isolation structure IS may electrically separate the source structures SC of the cell array structures CS from each other. The source structure SC of each of the cell array structures CS may be horizontally extended onto the buried insulating layer 105 and may be in contact with the isolation structure IS. The isolation structure IS may be interposed between the source structures SC of the first pair of the cell array structures CS, which are adjacent to each other in the first direction D1, and may be extended into a region between the source structures SC of the second pair of the cell array structures CS, which are adjacent to each other in the second direction D2. The isolation structure IS may electrically separate the source structures SC of the cell array structures CS, which are adjacent to each other in the first and second directions Di and D2, from each other.

Additional isolation structures IS may be disposed on each of the chip regions 10 of the semiconductor substrate 1. The additional isolation structures IS may be disposed along an edge of each of the chip regions 10 to enclose the cell array structures CS. The additional isolation structures IS at the edge of each of the chip regions 10 may be adjacent to the scribe line region 20. The source structures SC of the cell array structures CS arranged in the first direction D1 may be in common contact with a first one of the additional isolation structures IS. In this case, the first one of the additional isolation structures IS may have a line shape extending in the first direction D1. The source structures SC of the cell array structures CS arranged in the second direction D2 may be in common contact with a second one of the additional isolation structures IS. In this case, the second one of the additional isolation structures IS may have a line shape extending in the second direction D2. In exemplary embodiments of the inventive concept, the additional isolation structures IS may be spaced apart from the isolation structure IS, but the inventive concept is not limited to this example. For example, the additional isolation structures IS and the isolation structure IS may be connected to each other to constitute a single object.

Figure 21:
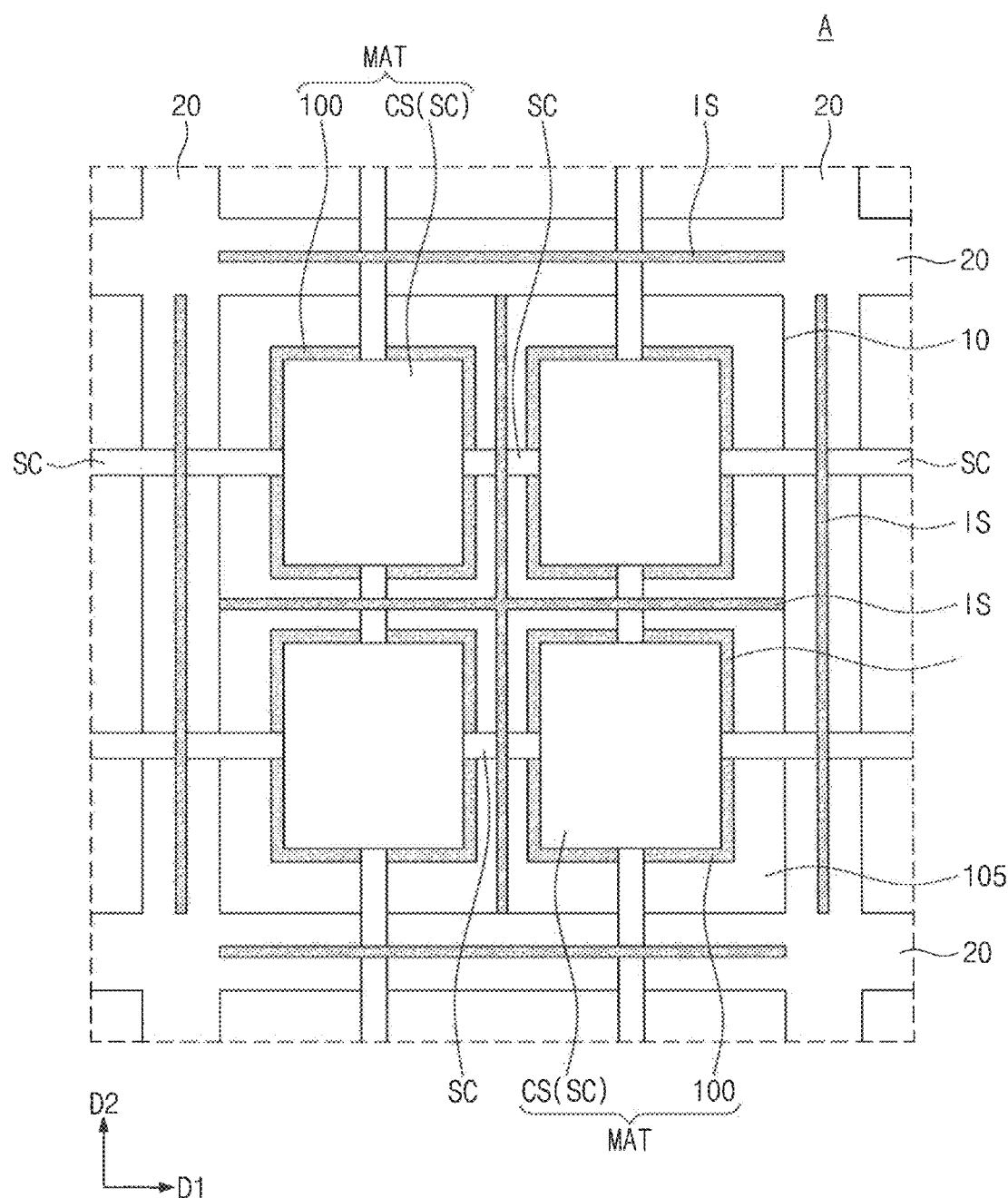
FIG. 21 is an enlarged plan view schematically illustrating a portion (e.g., the portion 'A' of FIG. 1) of a three-dimensional semiconductor memory device according to an exemplary embodiment of the inventive concept.

FIG. 21 is an enlarged plan view schematically illustrating a portion (e.g., the portion 'A' of FIG. 1) of a three-dimensional semiconductor memory device according to an exemplary embodiment of the inventive concept. For convenience, the description that follows will mainly refer to features different from that described with reference to FIGS. 1 to 7.

Referring to FIG. 21, an isolation structure IS may be disposed on each of the chip regions 10 of the semiconductor substrate 1. For example, the isolation structure IS may be disposed on the buried insulating layer 105 between the semiconductor layers 100. The isolation structure IS may be substantially the same as the isolation structure IS described with reference to FIG. 20. However, in the present embodiment, additional isolation structures IS may be disposed on the scribe line region 20 and may enclose each of the chip regions 10. The source structures SC of the cell array structures CS arranged in the first direction D1 may be in common contact with a first one of the additional isolation structures IS. In this case, the first one of the additional isolation structures IS may have a line shape extending in the first direction D1. The source structures SC of the cell array structures CS arranged in the second direction D2 may be in common contact with a second one of the additional isolation structures IS. In this case, the second one of the additional isolation structures IS may have a line shape extending in the second direction D2. In exemplary embodiments of the inventive concept, the additional isolation structures IS may be spaced apart from the isolation structures IS on the chip regions 10.

Figure 22:
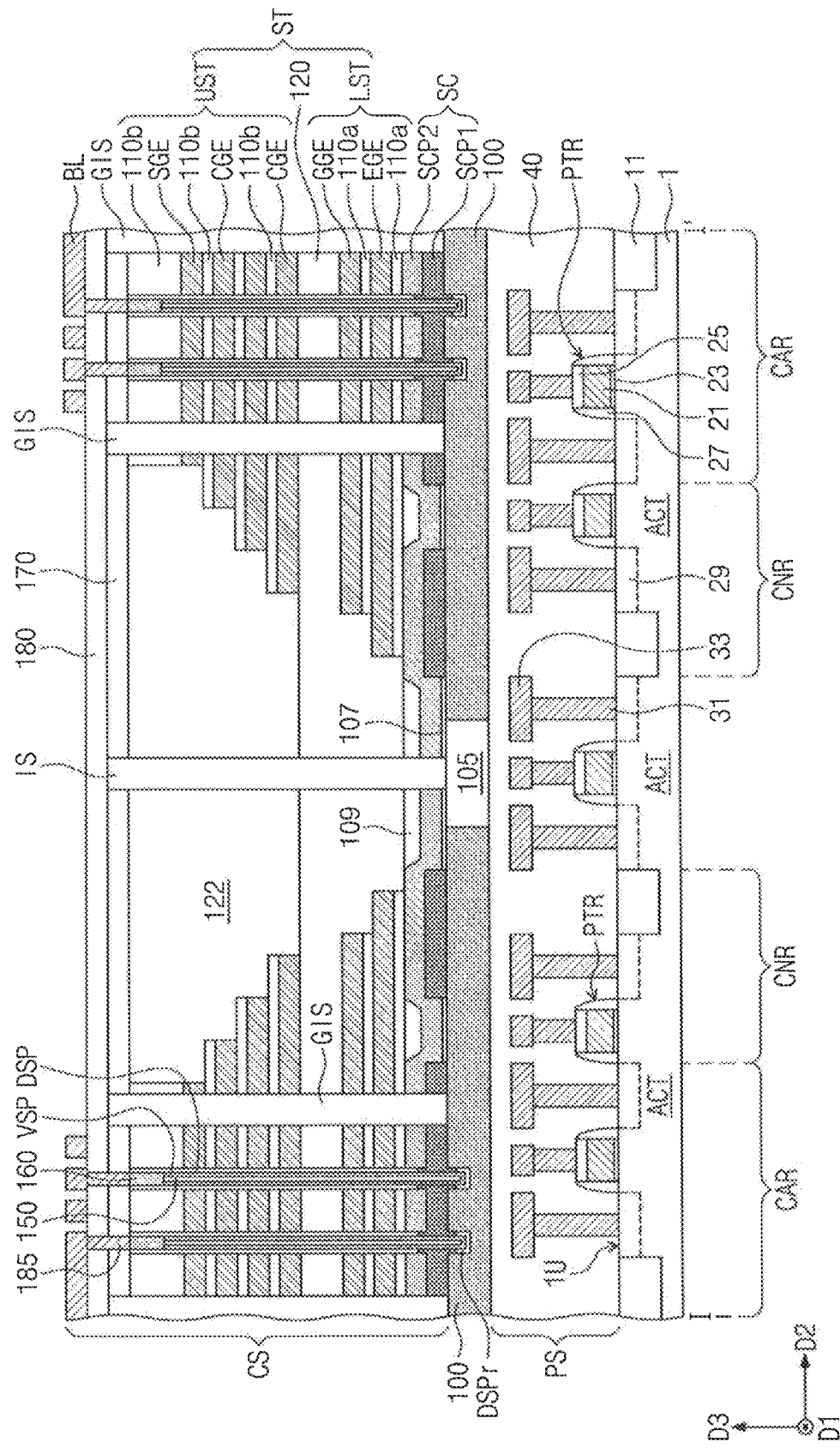
FIG. 22 is a sectional view illustrating a three-dimensional semiconductor memory device according to an exemplary embodiment of the inventive concept, taken along the line I-I' of FIG. 4.

FIG. 22 is a sectional view illustrating a three-dimensional semiconductor memory device according to an exemplary embodiment of the inventive concept, taken along the line 14' of FIG. 4. For convenience, the description that follows will mainly refer to features different from that described with reference to FIGS. 1 to 7.

Referring to FIGS. 4 and 22, in the present embodiment, the electrode isolation structures GIS may be formed of an insulating material. In this case, each of the cell array structures CS may include an additional interconnection line to apply a source voltage to the source structure SC. The isolation structure IS may be formed of an insulating material. The isolation structure IS may include the same insulating material as the electrode isolation structures GIS.

According to an exemplary embodiment of the inventive concept, the source conductive layer SCL may be formed as a single layer, which covers the semiconductor layers 100 and the buried insulating layer 105, and may be in direct contact with the semiconductor substrate 1 at the edge 1ED of the semiconductor substrate 1. The anisotropic etching process to form the vertical holes VH may be performed on a structure, in which the source conductive layer SCL is in contact with the semiconductor substrate 1, and thus, positive charges produced during the anisotropic etching process may be discharged to the semiconductor substrate 1 through the source conductive layer SCL. Thus, it is possible to prevent the positive charges, which are produced during the anisotropic etching process, from being accumulated in the semiconductor layers 100 and from causing an arcing in the semiconductor layers 100. The isolation structure IS may be used to cut (or separate) the source conductive layer SCL on the buried insulating layer 105 between the semiconductor layers 100. The cut source conductive layer SCL may constitute the second source conductive pattern SCP2 of the source structure SC. The cell array structures CS may be disposed on the semiconductor layers 100, which are horizontally spaced apart from each other, and the source structures SC of the cell array structures CS may be electrically separated from each other by the isolation structure IS. Thus, the erase operation may be independently performed on each of the cell array structures CS.

According to an exemplary embodiment of the inventive concept, a source conductive layer may be formed as a single layer, which is disposed at an edge of a semiconductor substrate to be in direct contact with the semiconductor substrate. When an anisotropic etching process is performed to form vertical holes, the source conductive layer may be in contact with the semiconductor substrate, and thus, positive charges produced during the anisotropic etching process may be discharged to the semiconductor substrate through the source conductive layer. Accordingly, it is possible to prevent an arcing failure caused by the positive charges and consequently to increase reliability of a three-dimensional semiconductor memory device.

While the inventive concept has been particularly shown and described with reference to exemplary embodiments thereof, it will be understood by one of ordinary skill in the art that variations in form and detail may be made thereto without departing from the spirit and scope of the attached claims.

What is claimed is:

1. A three-dimensional (3D) semiconductor memory device, comprising:
first and second semiconductor layers horizontally spaced apart from each other;
a buried insulating layer between the first and second semiconductor layers;
a first cell array structure disposed on the first semiconductor layer, and a second cell array structure disposed on the second semiconductor layer; and
an isolation structure disposed on the buried insulating layer between the first and second cell array structures,
wherein the first cell array structure comprises:
an electrode structure including electrodes, which are stacked in a direction perpendicular to a top surface of the first semiconductor layer; and
a first source structure disposed between the first semiconductor layer and the electrode structure,
the first source structure is extended onto the buried insulating layer, and
the isolation structure is between the first source structure of the first cell array structure and a second source structure of the second cell array structure.

2. The 3D semiconductor memory device of claim 1, wherein the first and second source structures of the first and second cell array structures are electrically separated from each other by the isolation structure.

3. The 3D semiconductor memory device of claim 1, wherein the first source structure of the first cell array structure is in contact with a side surface of the isolation structure.

4. The 3D semiconductor memory device of claim 1, wherein a bottom surface of the isolation structure is in contact with the buried insulating layer.

5. The 3D semiconductor memory device of claim 1, wherein the first cell array structure comprises an electrode isolation structure penetrating the electrode structure and the first source structure,
the electrode isolation structure has a line shape extending in a direction parallel to the top surface of the first semiconductor layer, and
the isolation structure comprises a same material as the electrode isolation structure.

6. The 3D semiconductor memory device of claim 5, wherein a top surface of the isolation structure is at a same height as a top surface of the electrode isolation structure.

7. The 3D semiconductor memory device of claim 5, wherein the first cell array structure comprises vertical structures penetrating the electrode structure and the first source structure, and
each of the vertical structures is extended into the first semiconductor layer.

8. The 3D semiconductor memory device of claim 7, wherein the vertical structures are connected to the first source structure.

9. The 3D semiconductor memory device of claim 7, Wherein the first cell array structure comprises bit lines, which are disposed on the electrode structure and are connected to the vertical structures, and
a top surface of the isolation structure is higher than top surfaces of the vertical structures and lower than bottom surfaces of the bit lines.

10. The 3D semiconductor memory device of claim 1, wherein the first cell array structure comprises:
vertical structures penetrating the electrode structure and the first source structure; and
bit lines disposed on the electrode structure and connected to the vertical structures;
wherein a top surface of the isolation structure is higher than top surfaces of the vertical structures and lower than bottom surfaces of the bit lines.

11. The 3D semiconductor memory device of claim 1, further comprising a peripheral circuit structure on a substrate,
wherein the peripheral circuit structure comprises peripheral circuits, which are disposed on the substrate, and a lower insulating layer, which covers the peripheral circuits, and
the first and second semiconductor layers and the buried insulating layer are disposed on the lower insulating layer.

12. The 3D semiconductor memory device of claim 1, wherein the isolation structure comprises a conductive pattern and an insulating spacer between the first and second source structures and the conductive pattern.

13. The 3D semiconductor memory device of claim 1, further comprising an insulating layer disposed on the buried insulating layer and filling a region between the first and second cell array structures,
wherein the isolation structure is extended in the direction perpendicular to the top surface of the first semiconductor layer, and penetrates at least a portion of the insulating layer.

14. A three-dimensional (3D) semiconductor memory device, comprising:
first and second semiconductor layers horizontally spaced apart from each other, on a substrate;
first and second cell array structures disposed on the first and second semiconductor layers, respectively; and
an isolation structure disposed on the substrate between the first and second cell array structures,
wherein the first cell array structure comprises:
an electrode structure including electrodes, which are stacked in a direction perpendicular to a top surface of the first semiconductor layer; and
a first source structure disposed between the first semiconductor layer and the electrode structure, and
the first source structure of the first cell array structure is horizontally extended onto an area of the substrate between the first and second semiconductor layers, and
the first source structure of the first cell array structure and a second source structure of the second cell array structure are electrically separated from each other by the isolation structure.

15. The 3D semiconductor memory device of claim 14, further comprising:
a third semiconductor layer on the substrate; and
a third cell array structure disposed on the third semiconductor layer,
wherein the first, second and third semiconductor layers are spaced apart from each other in a first direction and a second direction, which are parallel to a top surface of the substrate,
the isolation structure comprises a plurality of isolation structures,
a first one of the plurality of the isolation structures is disposed between the first and second cell array structures, which are adjacent to each other in the first direction,
a second one of the plurality of isolation structures is disposed between the first and third cell array structures, which are adjacent to each other in the second direction, and the plurality of isolation structures are spaced apart from each other.

16. The 3D semiconductor memory device of claim 14, further comprising:
   third and fourth semiconductor layers horizontally spaced apart from each other, on the substrate; and
   third and fourth cell array structures disposed on the third and fourth semiconductor layers, respectively,
   wherein the first, second, third and fourth semiconductor layers are spaced apart from each other in a first direction and a second direction, which are parallel to a top surface of the substrate, and
   the isolation structure is disposed between the first and second cell array structures, which are adjacent to each other in the first direction, and is extended into a region between the third and fourth cell array structures, which are adjacent to each other in the first direction.

17. The 3D semiconductor memory device of claim 14, further comprising:
   peripheral circuits disposed on the substrate; and
   a lower insulating layer covering the peripheral circuits,
   wherein the first and second semiconductor layers and the isolation structure are disposed on the lower insulating layer, and
   the first and second source structures of the first and second cell array structures are horizontally extended onto the lower insulating layer between the first and second semiconductor layers.

18. The 3D semiconductor memory device of claim 14, wherein the first and second source structures of the first and second cell array structures are in contact with a side surface of the isolation structure.

19. The 3D semiconductor memory device of claim 14, further comprising a buried insulating layer, which is disposed on the substrate and is between the first and second semiconductor layers,
   wherein the isolation structure is disposed on the buried insulating layer, and
   the first and second source structures of the first and second cell array structures are extended from the first and second semiconductor layers onto the buried insulating layer.

20. A three-dimensional (3D) semiconductor memory device, comprising:
   first and second semiconductor layers separated from each other by a buried insulating layer;
   a first cell array disposed on the first semiconductor layer, and a second cell array disposed on the second semiconductor layer; and
   an isolation structure disposed on the buried insulating layer and separating the first and second cell arrays from each other,
   wherein the first cell array comprises:
      a plurality electrodes stacked in a direction perpendicular to a top surface of the first semiconductor layer; and
      a source structure disposed between the first semiconductor layer and a lowermost one of the electrodes,
   wherein the source structure overlaps the buried insulating layer.

* * * * *